(12) United States Patent
Wang

(10) Patent No.: US 8,031,524 B2
(45) Date of Patent: Oct. 4, 2011

(54) STRUCTURES AND METHODS TO STORE INFORMATION REPRESENTABLE BY A MULTIPLE-BIT BINARY WORD IN ELECTRICALLY ERASABLE, PROGRAMMABLE READ-ONLY MEMORY (EEPROM)

(75) Inventor: Lee Wang, Diamond Bar, CA (US)

(73) Assignee: FlashSilicon, Inc., Diamond Bar, CA (US)

( * ) Notice: Subject to any disclaimer, the term of this patent is extended or adjusted under 35 U.S.C. 154(b) by 396 days.

(21) Appl. No.: 12/392,283

(22) Filed: Feb. 25, 2009

(65) Prior Publication Data

US 2009/0175079 A1 Jul. 9, 2009

Related U.S. Application Data

(63) Continuation-in-part of application No. 11/449,223, filed on Jun. 7, 2006, now Pat. No. 7,515,465.

(51) Int. Cl.
*G11C 16/04* (2006.01)
(52) U.S. Cl. ......... 365/185.03; 365/185.05; 365/185.19; 365/185.29; 257/315
(58) Field of Classification Search ............. 365/185.03, 365/185.05, 185.19, 185.24, 185.26, 185.29, 365/148; 257/315
See application file for complete search history.

(56) References Cited

U.S. PATENT DOCUMENTS

| 6,614,687 B2 * | 9/2003 | Chen et al. ............... 365/185.18 |
| 2007/0158733 A1 * | 7/2007 | Huang et al. ............... 257/315 |

* cited by examiner

*Primary Examiner* — Tuan Nguyen
*Assistant Examiner* — Toan Le
(74) *Attorney, Agent, or Firm* — Haynes and Boone, LLP

(57) ABSTRACT

Innovative structures and methods to store information capable of being represented by an n-bit binary word in electrically erasable Programmable Read-Only memories (EEPROM) are disclosed. To program a state below the highest threshold voltage for an N-type Field Effect Transistor (NFET) based EEPROM, the stored charge in the floating gate for the highest threshold voltage is erased down to the desired threshold voltage level of the EEPROM by applying an appropriate voltage to the control gate and drain of the NFET. The erase-down uses drain-avalanche-hot hole injection (DAHHI) for the NFET memory device to achieve the precise threshold voltage desired for the NFET EEPROM device. The method takes advantage of the self-convergent mechanism from the DAHHI current in the device, when the device reaches a steady state. For a "READ" operation, a read voltage is applied to the control gate and the drain is connected by a current load to the positive voltage supply. Using the distinctive threshold voltage associated with the different stored charges, the output voltage from the drain is distinctively recognized and converted back to the original n-bit word. A similar method for a PFET EEPROM is also disclosed.

21 Claims, 25 Drawing Sheets

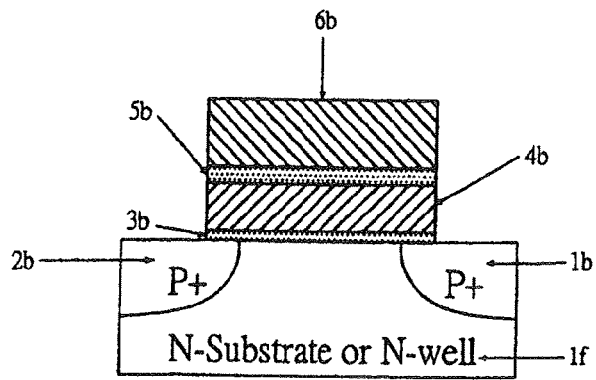
FIG. 2a    (PRIOR ART)
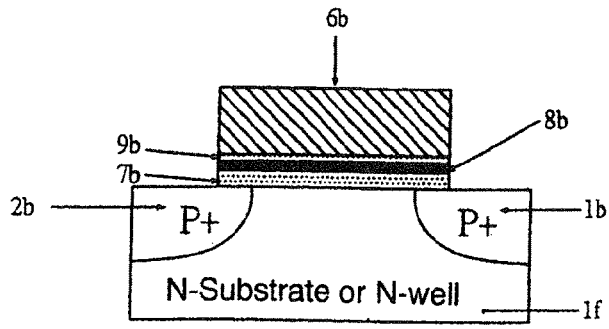
FIG. 2b    (PRIOR ART)
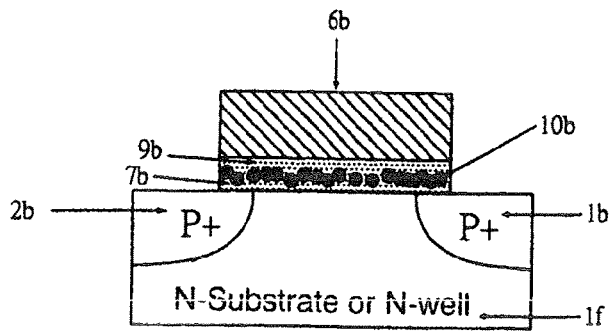
FIG. 2c    (PRIOR ART)

|  | $B_1$ | $B_2$ | ......... | $B_{\log_2(n+1)-1}$ | $B_{\log_2(n+1)}$ |
|---|---|---|---|---|---|
| $P_0$ | 1 | 1 | ......... | 1 | 1 |
| $P_1$ | 0 | 1 | ......... | 1 | 1 |
|  |  |  |  |  |  |
| $P_{n-1}$ | 0 | 0 | ......... | 0 | 1 |
| $P_n$ | 0 | 0 | ......... | 0 | 0 |

FIG. 8

STRUCTURES AND METHODS TO STORE INFORMATION REPRESENTABLE BY A MULTIPLE-BIT BINARY WORD IN ELECTRICALLY ERASABLE, PROGRAMMABLE READ-ONLY MEMORY (EEPROM)

This application is a continuation in part of U.S. patent application Ser. No. 11/449,223 filed Jun. 7, 2006 now U.S. Pat. No. 7,515,465, entitled "Structures and Methods to Store Information Representable by a Multiple Bit Binary Word in Electrically Erasable, Programmable Read-Only Memories (EEPROM),"

BACKGROUND OF THE INVENTION

1. Field of the Invention

The invention relates to an Electrically Erasable Programmable Read-Only Memory (EEPROM), and more specifically, to structures and methods for enabling multiple-threshold voltage operation in single EEPROM cell.

2. Description of the Prior Art

Semiconductor non-volatile memory (NVM), and particularly electrically erasable, programmable read-only memory (EEPROM), is used in a range of electronic equipment from computers, to telecommunications hardware, to consumer appliances, and to subscriber identity modules (SIMs) for mobile phones. In general, EEPROMs serve a niche in the NVM space as a mechanism for storing firmware and data that can be preserved even when power is interrupted and yet can be altered as needed. The flash EEPROM may be regarded as a specifically configured EEPROM that may be erased on a global or sector-by-sector basis.

As is well known to those skilled in the art and as shown in FIGS. 1a~1e and 2a~2e, EEPROM cells with drain/source regions 1a, 1b, 1d, 1g, 13c, 13f and 2a, 2b, 2d, 2g, 9c, 9f, formed by ion implantation, are typically constructed by forming a field effect transistor (FET) in a body of semiconductor material (such as P-substrate or P-well 1e, 1c, 3d or N-substrate or N-well 1f, 2f, 3f), usually silicon. In one configuration, shown in FIGS. 1a and 2a, the FET can be made to store electrical charge in an insulated polysilicon gate electrode 4a or 4b, referred to as a floating gate 4a or 4b, separated from the underlying substrate 1e or 1f and the drain/source regions 1a and 2a or 1b and 2b by bottom oxide layer 3a or 3b and from an overlying gate conductor 6a or 6b by a top oxide layer 5a or 5b. Besides this typical cell architecture, there are also many different types of device cells. For example, in the semiconductor-oxide-nitride-oxide-semiconductor (SONOS) NVM cell architecture, shown in FIG. 1b (2b) (hereinafter, to eliminate redundancy, the numbers in parentheses refer to the elements in the Figure the number of which is in parenthesis), the gate structure includes an oxide layer 7a (7b), a nitride layer 8a (8b) and an oxide layer 9a (9b) which together formed an oxide-nitride-oxide (ONO) dielectric stack. Charges are stored in the nitride layer 8a (8b) that is separated from the silicon substrate 1e (1f) by a bottom oxide layer 7a (7b) and from a poly-silicon gate conductor 6a (6b) by a top oxide layer 9a (9b). As shown in FIG. 1c (2c), the NVM cell is fabricated on a layer of isolated polycrystalline storage islands (made of polycrystalline particles) 10a (10b) that is formed underneath a control poly-silicon gate electrode 6a (6b).

The single-poly NVM cell architecture shown in FIG. 1d (2d) applies poly-silicon on top of the silicon substrate or well inside silicon substrate 1c (2f) to form a single poly-silicon floating gate 11a (11b) and control gate 12a (12b) respectively, (folded control gate electrode 10c (10f)).

The structure of a split-gate NVM shown in FIG. 1e (2e) uses poly-silicon on a silicon substrate (well) 3d (3f) to form a polysilicon floating gate 13a (13b), a control gate 14a (14b) separated from the polysilicon floating gate 13a (13b) by control dielectric 15a (15b) and tunneling dielectric 16a (16b) between the floating gate 13a (13b) and the underlying substrate or well 3d (3f).

Data is stored in an EEPROM cell by modulating the threshold voltage, $V_{th}$, of the FET through the injection of charge carriers into the charge-storage layer from the channel of the FET. For example, with respect to an N channel FET, an accumulation of electrons in the floating gate, or in a dielectric layer above the FET channel region, causes the FET to exhibit a relatively high positive $V_{th}$. When the FET control gate is biased to the voltage required to read stored data, the FET, with a fixed drain voltage, will respond with different source-to-drain currents according to its $V_{th}$ level. The different source-to-drain current responses can be recognized and converted to the original bit information stored on the charge storage layer of the FET.

The number of bits stored in an EEPROM cell is determined by the number of different current responses, given by number-of-bits=$\log_2$ (number of current responses). The more different current responses that can be sensed and resolved, the more bits that can be stored in a single device cell. In modem sense amplifier (SA) design, the current can be measured with very high accuracy and speed. Usually reference cells are used to compare the current response and determines the bit-level information. However, the major challenge to achieving multi-bit storage in a single device cell is to accurately program or erase the charge-storage layer so as to achieve a designated threshold voltage level which results in a consistent device current response under the read operation.

In the conventional write and erase schemes, Drain-Avalanche-Hot Carrier Injection (DAHCI) and Fowler-Nordheim Tunneling (FNT) have been used for programming and erasing, respectively. The amount of charge injected into/out of the floating gate is controlled by the DAHCI/FNT currents generated by applying voltage pulses to the device gate and electrodes (source, drain, and substrate). Since there is no self-convergent mechanism for DAHCI programming and FNT erasing, the amount of charge in the floating gate which controls and determines the device threshold voltage shift is controlled by the durations of the voltage pulses applied to the gate and to the electrodes. Due to non-uniformity of distributed voltage supply across an integrated circuit memory and the RC time constant delay for a given voltage to reach individual devices in a memory array, the threshold voltage shifts associated with the devices in a memory array after conventional programming and erasing, are usually widely spread out. This hinders multiple-level recognition in a large number of cells in an array memory. To reduce such threshold voltage shift variations, an extra convergent circuit is usually supplied to fine-tune the desired threshold voltage level for each individual device cell in an EEPROM memory array. However, such an approach not only requires a complicated convergence circuit with more silicon area but also requires lengthy and time-consuming convergent procedures during programming.

In view of the aforementioned, the present invention provides an innovative scheme to achieve multiple-bit storage in electrically erasable programmable read-only memories (EEPROMs) to overcome the above drawbacks.

SUMMARY OF THE INVENTION

One object of the present invention is to enable multiple threshold voltage operation in a single EEPROM cell. Multiple threshold voltage operation leads to multiple-bits storage in a single cell.

Multiple-bits storage in a single cell can reduce the per-bit cost for electrically erasable programmable read-only memories (EEPROMs). For instance, storing two bits in a single cell reduces the silicon memory cell area by one-half. In particular, since this invention applies device self-convergent Drain-Avalanche-Hot Hole Injection (DAHHI) for the NFET EEPROM and Drain-Avalanche-Hot Electron Injection (DAHEI) for the PFET EEPROM, respectively, complicated convergent circuits for overcoming over-erase issues in the conventional scheme are not required. Therefore, the large silicon area required for the complicated convergent circuits is not incurred.

One aspect of the present invention provides self-convergent programming/erasing structures and methods for storing information capable of being represented by an n-bit binary word, where n is a selected integer, in a single nonvolatile memory cell. Such a structure may include: a NFET based nonvolatile memory cell having a source electrode capable of being coupled to a low voltage; and a switching circuit capable of being coupled to a drain of the NFET based nonvolatile memory cell, for presenting information representable by an n-bit binary word to be stored in the NFET based nonvolatile memory cell.

The switching circuit includes resistors connected in parallel, wherein the resistors have a common node for connection to a high voltage source. The resistances of the resistors are different from each other. A control gate voltage switch having one end connected to a control gate and another end capable of being switched between a high voltage and an erase voltage may also be provided. The nonvolatile memory may include an NFET-based electrically erasable programmable read-only memory (EEPROM).

A further aspect of the invention provides a self-convergent programming/erasing structure for multiple-bit storage in a single nonvolatile memory cell. Such a structure includes: an NFET based nonvolatile memory cell having a resistor capable of being coupled between a drain and a high voltage source; and a multiple level voltage-provider coupled to a control gate of the nonvolatile memory cell for presenting a selected voltage representing n bits of information to be stored in the NFET based nonvolatile memory cell. The amplitudes of voltages provided by the multiple level voltage-provider differ from each other. The nonvolatile memory includes an NFET based electrically erasable programmable read-only memory (EEPROM).

One embodiment of the present invention provides storage of information corresponding to any value of an n-bit binary word, where n is a selected integer, in a single nonvolatile memory cell. In this embodiment, a PFET based nonvolatile memory cell has a source electrode capable of being coupled to a high voltage source; and a switching circuit coupled to a drain of the PFET based nonvolatile memory cell for presenting a voltage representing the n-bit word to be stored in the PFET based nonvolatile memory cell.

The switching circuit includes resistors connected in parallel, wherein resistors have a common node capable of being connected to a low voltage source. The resistances of said resistors are all different. The present invention further comprises a control gate voltage switch having one end connected to a control gate and another end capable of being switched between a low voltage source and an erase voltage source. The nonvolatile memory includes PFET based Electrically Erasable Programmable Read-Only Memories (EEPROM).

The present invention provides structures and methods for storing information capable of being represented by a multiple bit binary word in a single nonvolatile memory cell. The memory cell may include: a PFET based nonvolatile memory cell having a resistor capable of being coupled between a drain and a source of a low voltage; and a source of multiple voltages capable of being coupled to a control gate of the nonvolatile memory cell for representing and presenting the information to be stored in the PFET based nonvolatile memory cell. The nonvolatile memory may include PFET based electrically erasable programmable read-only memory (EEPROM). The voltage amplitudes provided by the source of multiple voltages are different.

The present invention also provides a method for storing information representable by a multiple bit binary word in a single nonvolatile memory cell. The method may include: programming a NFET nonvolatile memory to a highest threshold voltage by applying a high voltage both to a control gate and a drain electrode of the nonvolatile memory; and erasing down from the highest threshold voltage to a specific threshold voltage by applying a gate voltage to the control gate and switching the drain electrode to a port of a switching circuit for presenting to the nonvolatile memory a signal representing the information to be stored in the nonvolatile memory cell. The information to be stored is representable by an n-bit binary word, where n is an integer.

One aspect of the present invention provides a method for storing information representable by a multiple-bit binary word in a single nonvolatile memory cell. The method may include: programming a NFET nonvolatile memory to a highest threshold voltage by applying a high voltage to a control gate and a drain electrode of the NFET based nonvolatile memory; and erasing down from the highest threshold voltage to a specific threshold voltage by applying a specific gate voltage to the control gate with a selected resistor coupling between the drain electrode and the high voltage source.

A further aspect of the invention provides a method for storing information representable by a multiple bit binary word in a single nonvolatile memory cell. The method may include: programming a PFET based nonvolatile memory to a most negative threshold voltage by applying a high voltage to both a source electrode and a substrate of the PFET nonvolatile memory; and erasing up from the most negative threshold voltage to a specific negative threshold voltage by applying a gate voltage to the control gate and switching the drain electrode to a port of a switching circuit for presenting to the drain a voltage representing the multiple bit binary word to be stored in the PFET nonvolatile memory cell.

Further, the present invention discloses a method for storing information representable by a multiple bit binary word in a single nonvolatile memory cell. The method may include: programming a PFET nonvolatile memory to a most negative threshold voltage by applying a high voltage to both a source electrode and to a substrate of the PFET nonvolatile memory; and erasing up from the most negative threshold voltage to a specific negative threshold voltage by applying a specific gate voltage to the control gate with a resistor of a selected value coupling between the drain electrode and a low voltage source.

An embodiment of the invention also provides a method for reading information representable as a multiple bit binary word stored as an electric charge in a single nonvolatile memory cell, comprising: applying a read voltage to a control gate of the nonvolatile memory; and connecting a drain electrode of the nonvolatile memory to a high voltage source through a current load; wherein the driving current of the nonvolatile memory in response to different threshold voltage levels generates different output voltages.

The output voltage in response to the actual threshold voltage can be compared and converted to the original bit representation. To achieve this, the nonvolatile memory comprises an NFET based electrically erasable programmable read-only memory (EEPROM).

Another embodiment of the invention provides a method for reading information representable by a multiple bit binary word stored in a single nonvolatile memory cell. The method may include: applying a read voltage to a control gate of the nonvolatile memory; and connecting a drain electrode of said nonvolatile memory to ground through a current sink; wherein the driving current of the nonvolatile memory passing through the current sink generates an output voltage representative of the actual threshold voltage which in turn reflects the value of the information stored in said cell.

The output voltage can be compared and converted to the original bit representation. The nonvolatile memory comprises a PFET based electrically erasable programmable read-only memory (EEPROM).

BRIEF DESCRIPTION OF THE DRAWINGS

FIGS. 2a~2e show typical cross-sectional views of PFET-based EEPROM cells of various architectures.

FIG. 8 shows a switch assignment table mapping ports $P_0$ to $P_n$ (FIGS. 6 and 7) each to a particular value (i.e. a combination) of the n bits $B_1 \sim B_{log2(n+1)}$; the selected resistor controls the charge stored on the floating gate 7n.

DETAILED DESCRIPTION OF THE EMBODIMENTS

The present invention includes methods and structures for storing any one of N voltage values in a single EEPROM cell, where each of the N voltage values can be represented by an n-bit binary word, where $n=\log_2 N$ and N in an integer (e.g., 8, 16 or 32), representable by a power of 2. Thus if N is 16, n is 4 and a four-bit binary code word is sufficient to represent any one of sixteen (16) possible voltage values which can be stored in the EEPROM cell.

The present invention relates to structures and methods for enabling multiple threshold voltage operation in a single EEPROM cell. Multiple threshold voltage level operation makes possible storing in a single cell information representable by n bits. Hereinafter, storing such information in a single cell is also referred to as "multiple-bit storage". Multiple-bit storage in a single cell reduces the per-bit cost in Electrically Erasable Programmable Read-Only Memories (EEPROM). For instance, storing two bits in a single cell halves the silicon memory cell area. In particular, in one embodiment of the present invention, because device self-convergent Drain-Avalanche-Hot Hole Injection (DAHHI) is applied for an NFET-based EEPROM and Drain-Avalanche-Hot Electron Injection (DAHEI) is applied for a PFET-based EEPROM, complicated convergent circuits for overcoming over-erase or over-programming, are not required. The present invention thus further reduces the silicon area requirement.

Figure 1A:
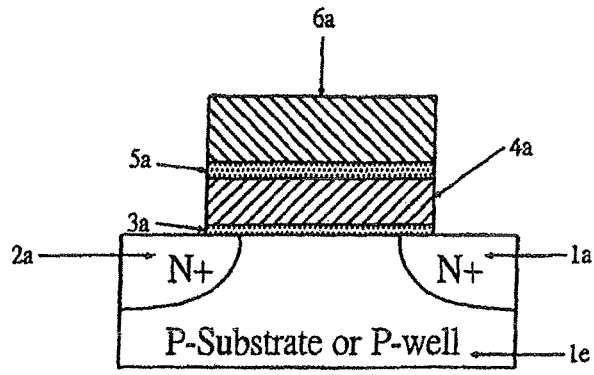
FIGS. 1a~1e show typical cross-sectional views of NFET-based EEPROM cells of various architectures.
Figure 1B:
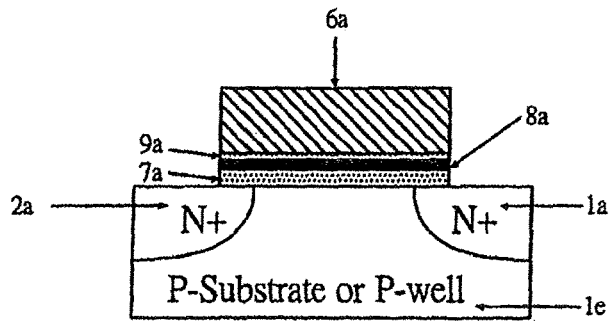
Figure 1C:
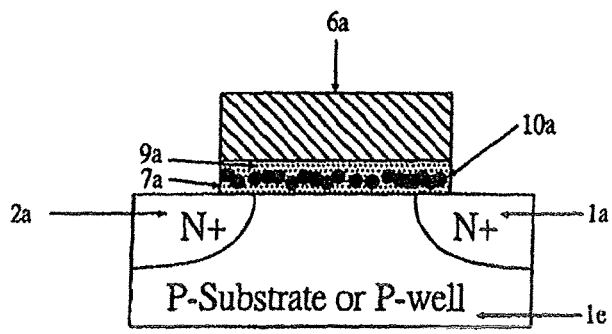
Figure 1D:
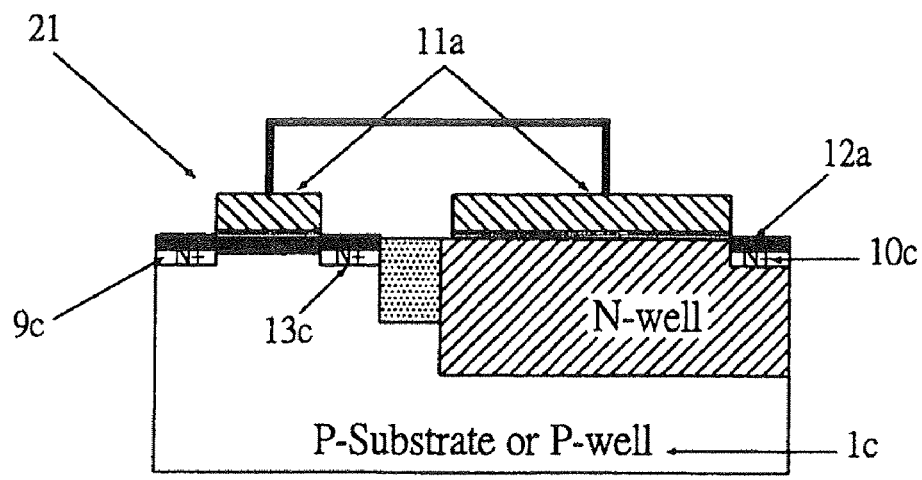
Figure 1E:
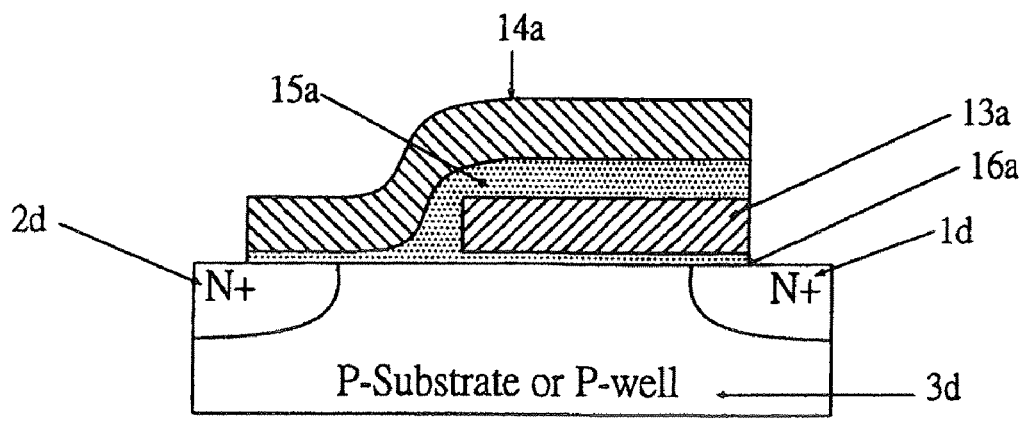
Figure 2D:
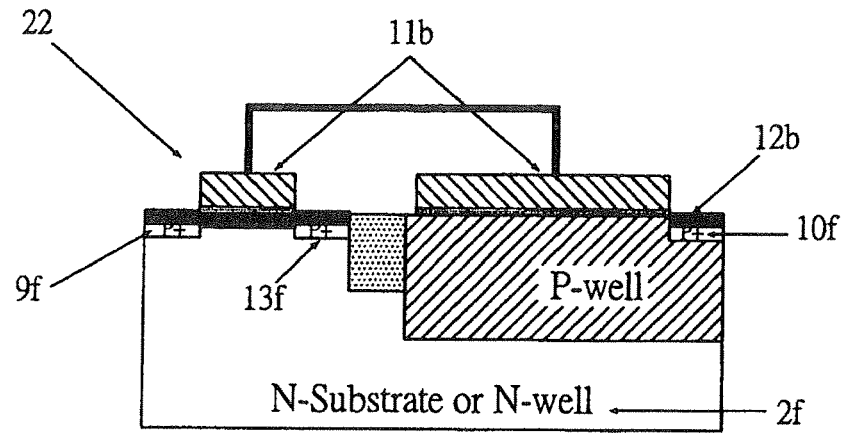
Figure 2E:
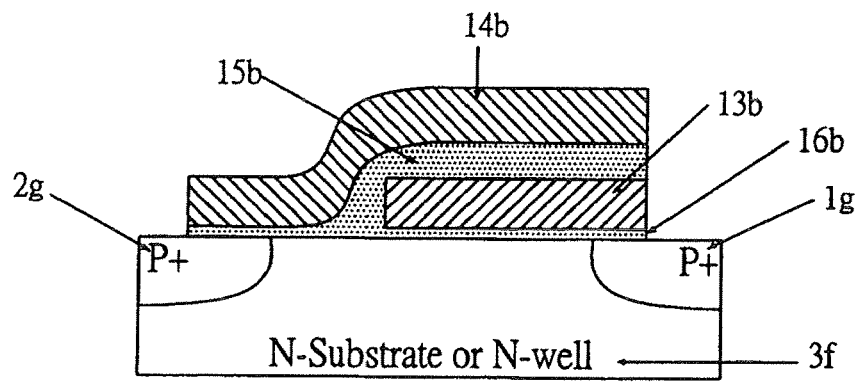
Figure 3A:
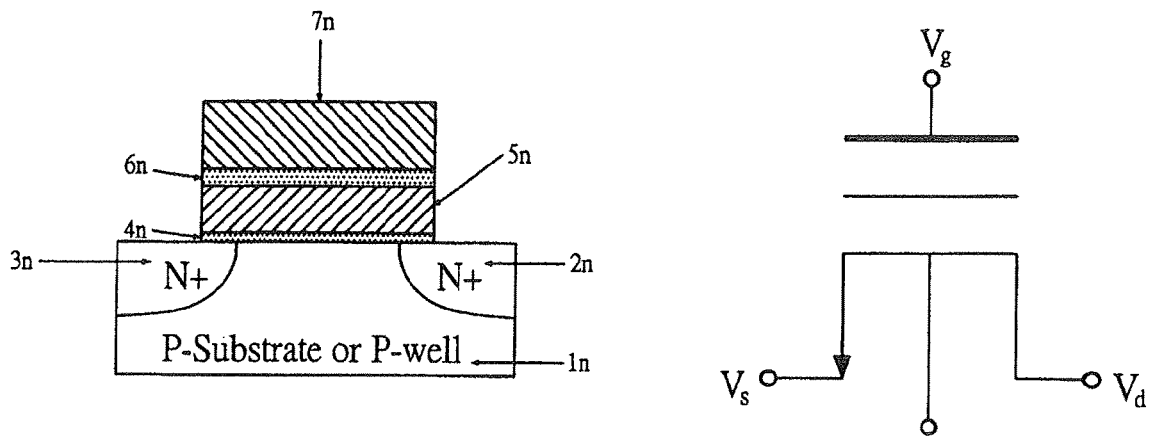
FIGS. 3a and 3b show N channel and P channel EEPROMs, respectively, and their equivalent circuits.
Figure 3B:
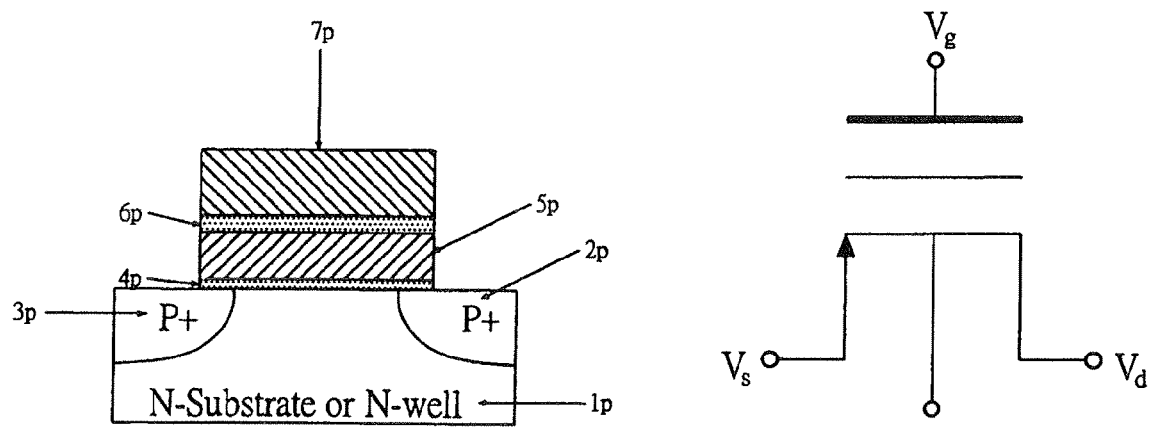

The present invention applies program/erase methods and structures to achieve precise EEPROM threshold voltages for multiple-bit storage in a single cell. FIGS. 3a and 3b shows NFET-based AND PFET-based EEPROMs and their equivalent circuits, respectively.

Figure 4A:
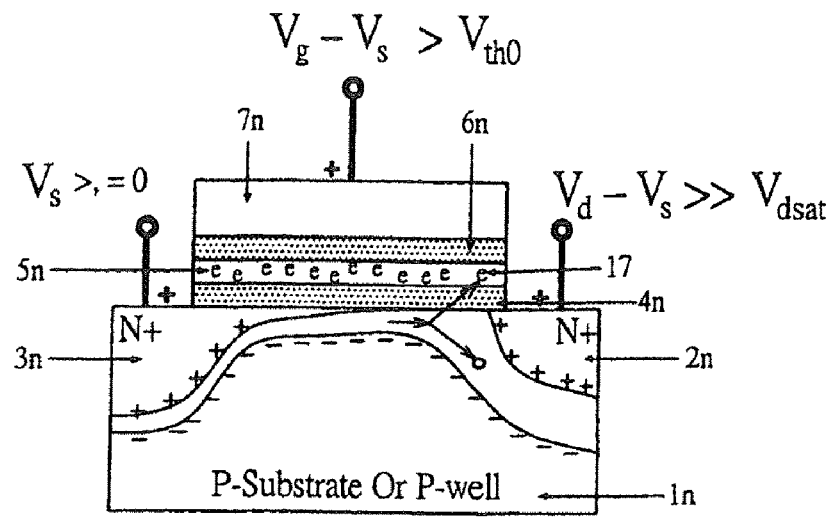
FIGS. 4a and 4b show, for an N-FET based EEPROM, cross-sectional views illustrating the electrical structure and the conditions for initial programming and for erasing-down to a specified threshold voltage, respectively.
Figure 4B:
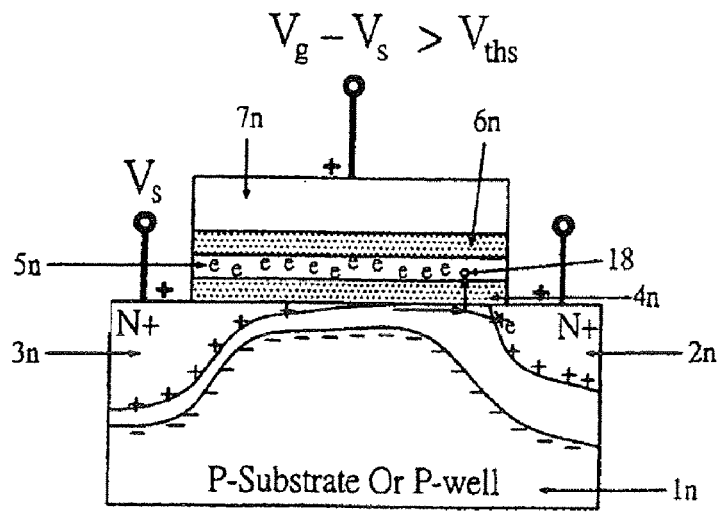
Figure 12:
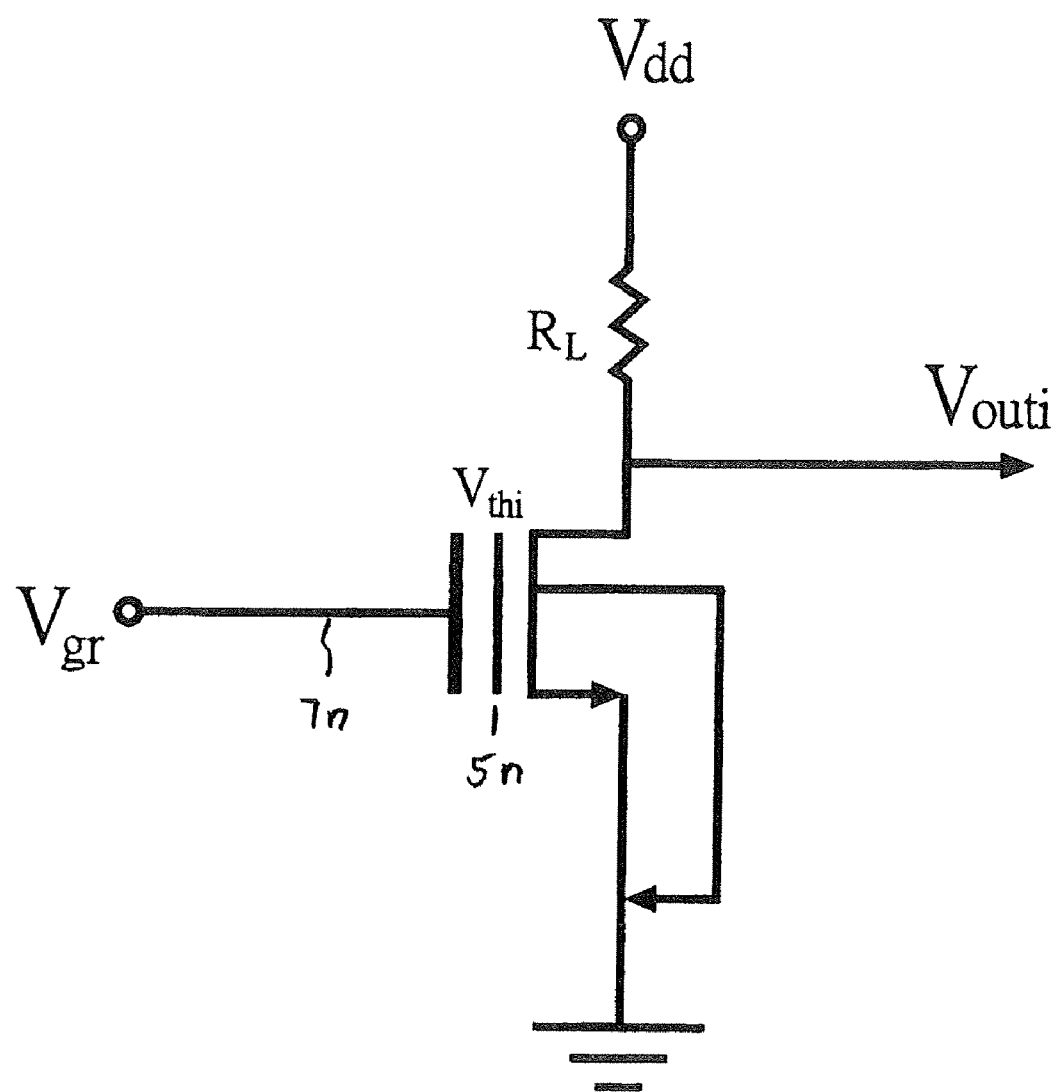

FIGS. 3a and 3b show NVM cells which include P-substrate or P-well 1n and N-substrate or N-well 1p, respectively. Drain/source regions 2n, 3n (FIG. 3a) or 2p, 3p (FIG. 3b), floating gates (FIG. 3a) or 5p (FIG. 3b) store charge representing different levels of information and are separated from the silicon substrate by a bottom oxide layer 4n (FIG. 3a) or 4p (FIG. 3b) and from a poly-silicon gate conductor 7n (FIG. 3a) or 7p (FIG. 3b) by a top oxide layer 6n (FIG. 3a) or 6p (FIG. 3b). Under the conditions of $V_g-V_s>V_{th0}$, where $V_g$ is the gate voltage, $V_s$ is the source voltage and $V_{th0}$ is the device original threshold voltage, and $V_d-V_s>>V_{dsat}$, where $V_d$ is the drain voltage and $V_{dsat}$ is the saturation voltage, an NFET-based EEPROM cell is initially programmed to the maximum threshold voltage $V_{thmax}$ by Drain-Avalanche-Hot Electron Injection (DAHEI) (FIG. 4a). The maximum number of electrons is stored in the floating gate 5n in this state. Then, a Drain-Avalanche-Hot Hole Injection (DAHHI) method is applied to erase-down to a specific threshold voltage (FIG. 4b). The device is "on and saturated" under the conditions, $V_g-V_s>V_{ths}$. In this situation, the saturation threshold voltage is lower than the linear threshold voltage $V_{thmax}$ due to Drain Induced Barrier Lowering (DIBL) with $V_d-V_s>>V_{dsat}$. The Drain-Avalanche-Hot Holes (DAHH) are injected into floating gate 5n and the hot holes gain energies from the horizontal potential difference $V_d-V_{dsat}$ and the vertical potential difference $V_d-V_f$, where $V_f$ is the floating gate potential. $V_f$ is a function of the charges stored in the floating gate and the applied control gate voltage $V_g$. The effect of electrons stored in or on floating gate 5n is initially reduced by the hot hole injection causing $V_{th}$ to drop and the drain current to increase. The drain current reaches a maximum steady current, when the horizontal potential $V_d-V_{dsat}$, and the vertical potential difference $V_d-V_f$ cannot provide enough energy for holes to flow over the floating gate 5n. When steady state is reached, the number of electrons in the floating gate remains constant and the device threshold voltage has self-converged to a lower threshold voltage which is a function of the applied control-gate voltage and the maximum drain current. For a "READ" operation, a read voltage $V_{gr}$ is applied on control gate 7n and drain electrode 2n is connected through load resistor $K_L$ to supply voltage $V_{dd}$, as shown in FIG. 12. Because of the distinctive device threshold voltage achieved using the erase-down process, the output voltage from the drain electrode 2n can be distinctively recognized and decoded into the original bit information it represents.

Figure 5A:
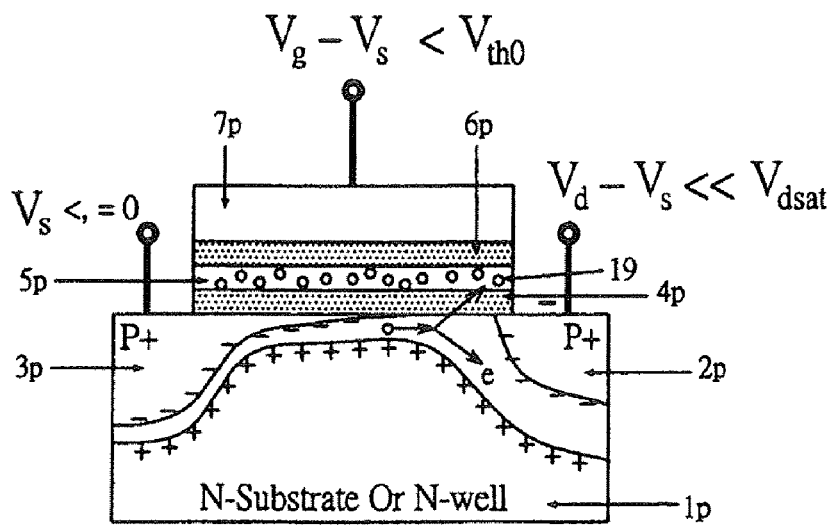
FIGS. 5a and 5b show, for a PFET based EEPROM, cross-sectional views illustrating the electrical structures and the conditions for initial programming and for erasing-up to a specified threshold voltage, respectively.
Figure 5B:
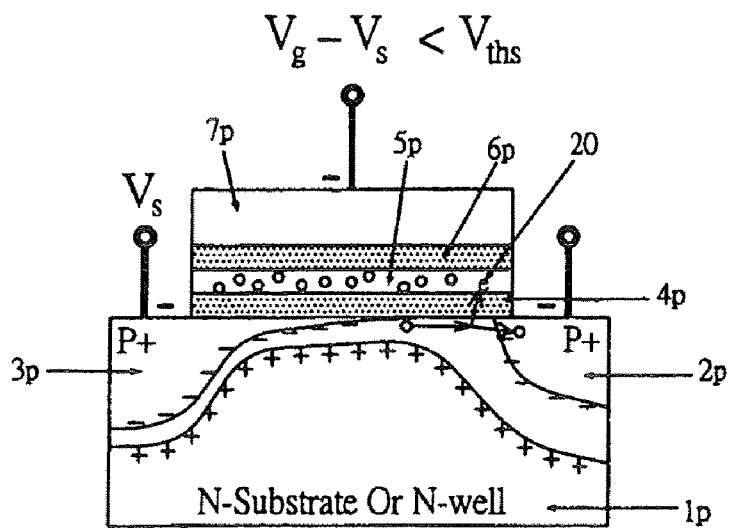
Figure 17:
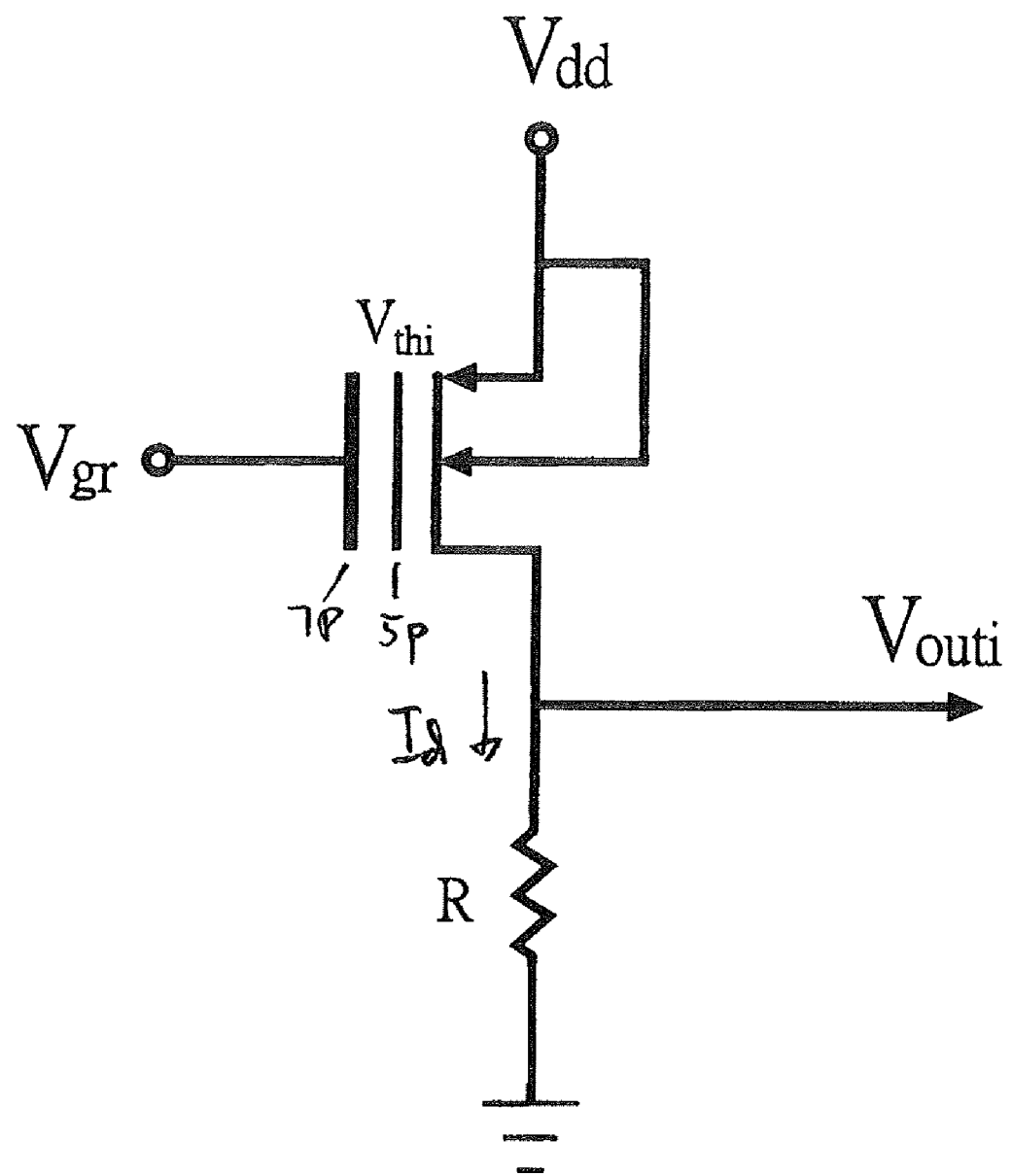
FIG. 17 shows a schematic for a "READ" operation of a PFET based EEPROM.

Similarly, under the conditions of $V_g-V_s<V_{th0}$, where $V_{th0}$ is the device original threshold voltage, and $V_d-V_s<<V_{dsat}$, where $V_{dsat}$ is the saturation voltage, a PFET-based EEPROM cell is initially programmed to the most negative threshold voltage $V_{thmax}$ by Drain-Avalanche-Hot Hole Injection (DAHHI) (FIG. 5a). A maximum number of holes is stored in floating gate 5p. Then a Drain-Avalanche-Hot Electron Injection (DAHEI) method is applied to erasing-up the threshold voltage to a specific negative threshold voltage (FIG. 5b). The device is "on and saturated" under the conditions, $V_g-V_s<V_{th0}$ where $V_{th0}$ is less negative than the linear threshold $V_{thmax}$ due to Drain Induced Barrier Lowering (DIBL) with saturation, $V_d-V_s<<V_{sat}$ (all negative for PFET). The Drain-Avalanche-Hot Electrons (DAHE) are injected into floating gate 5p and the hot electrons gain energies from the horizontal potential difference $V_d-V_{dsat}$ and the vertical potential difference $V_d-V_f$ where $V_f$ is the voltage on the floating gate. The charge on floating gate 5p resulting from holes stored in floating gate 5p is initially reduced due to the hot electron injection. The resulting charge raises $V_{th}$ and increases the drain current. Drain current reaches a maximum steady current when the threshold voltage reaches a stead state m, when the horizontal potential difference $V_d-V_{dsat}$ and the vertical potential difference $V_d-V_f$ can not provide enough energy for electrons to flow over oxide 4p into the floating gate 5p. When the steady state is reached, the number of holes in the floating gate 5p remains constant and the device threshold voltage self-converges to a higher negative threshold voltage. For a "READ" operation, the device is applied a read voltage $V_{read}$ at control gate 7p and drain electrode 2p is connected through a sink resistor R to source voltage $V_{ss}$ as shown in FIG. 17. Because of the distinctive threshold voltage obtained by the erasing-up process, the output voltage $V_{out}$ from drain electrode 2p can be distinctively recognized and decoded to the original bit information it represents.

Figure 6:
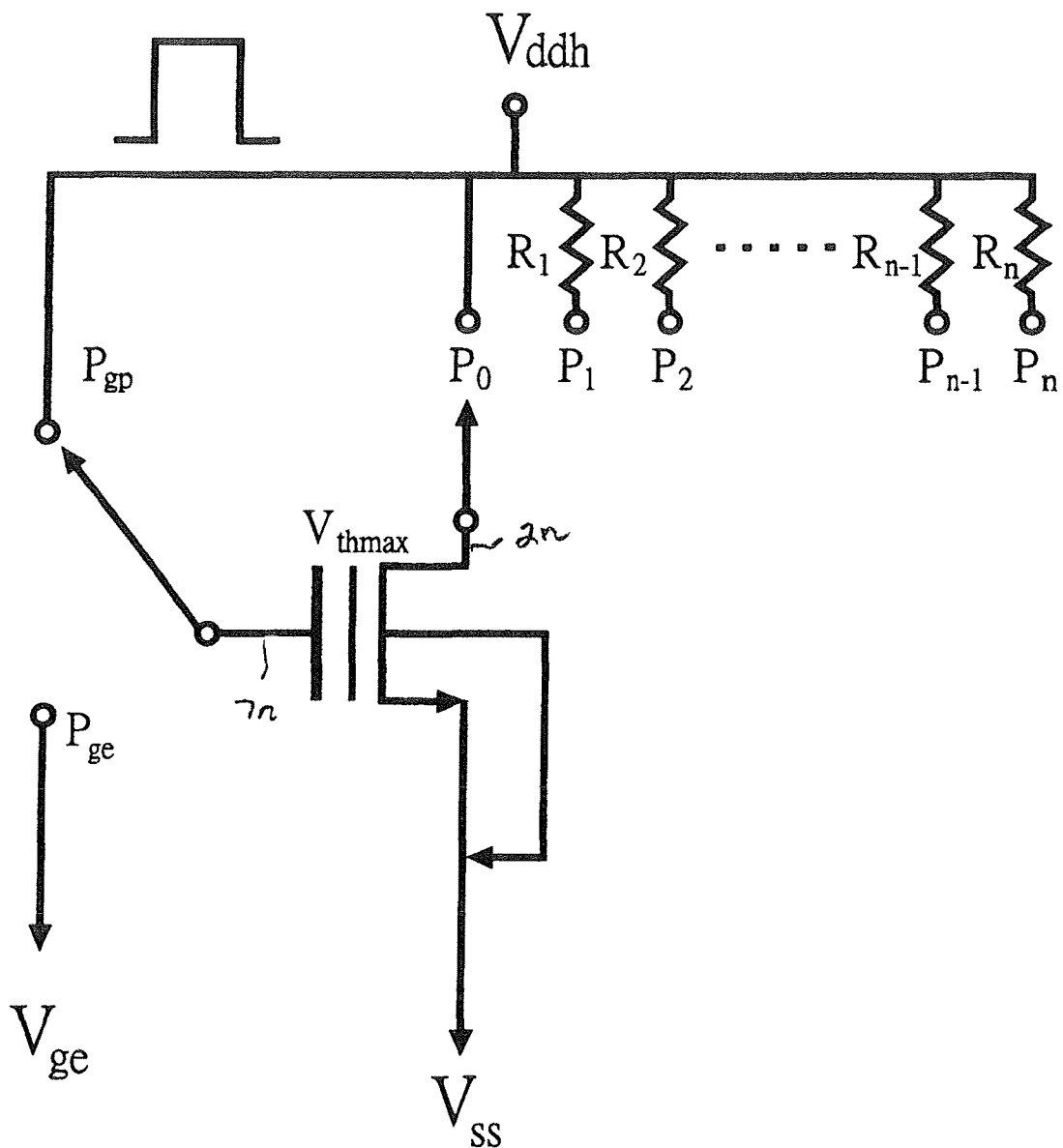
FIG. 6 shows an NFET-based EEPROM cell and a bank of resistors, $R_1, R_2, \ldots R_{n-1}, R_n$.
Figure 7:
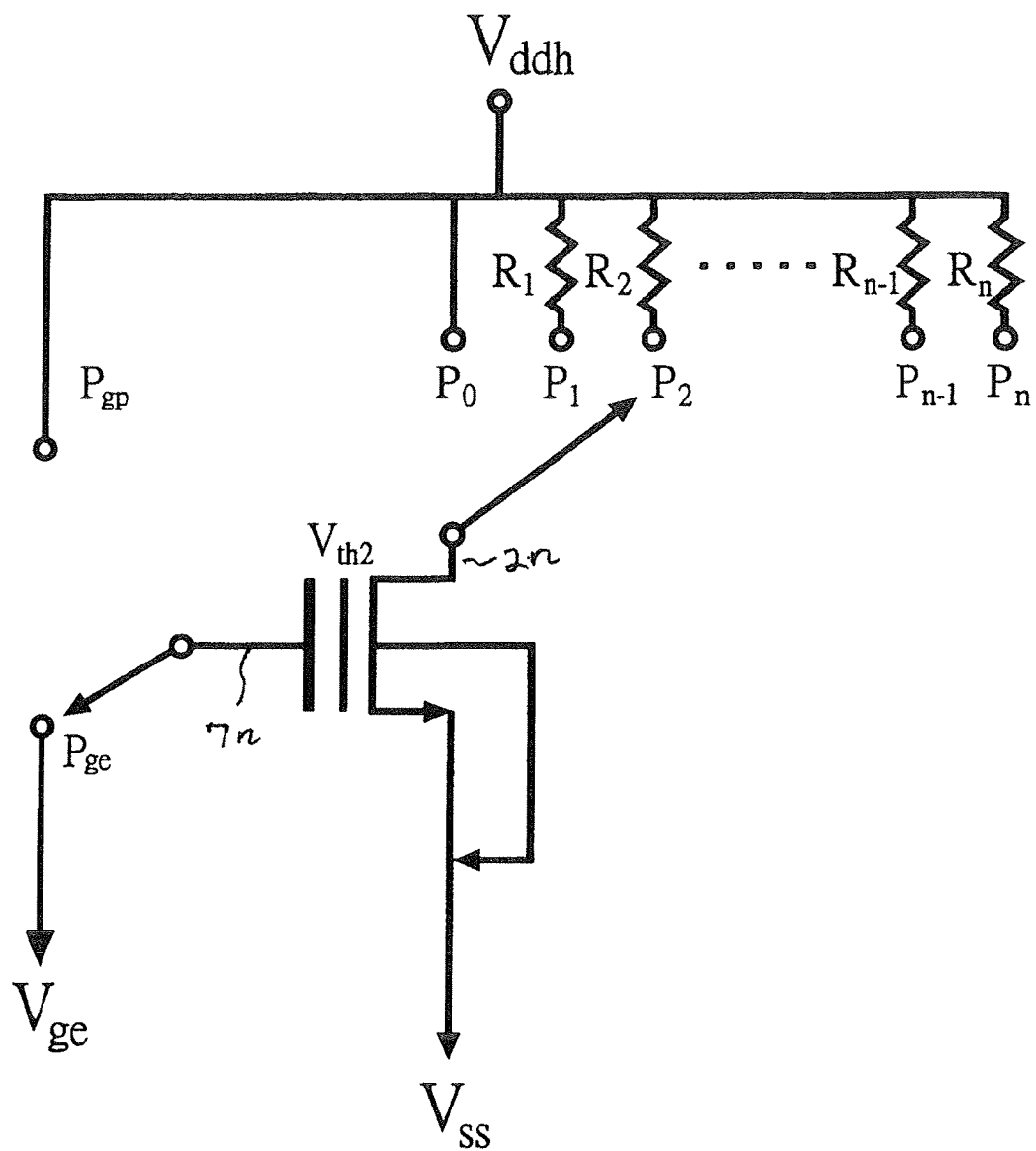
FIG. 7 illustrates the erase process to shift-down from the maximum threshold voltage $V_{thmax}$ to a specific threshold voltage $V_{th2}$.

FIG. 6 shows an NFET-based EEPROM cell and a bank of resistors, $R_1, R_2, \ldots R_{n-1}, R_n$. To represent a value (i.e., a specific combination of binary bits in an n-bit binary word), a corresponding resistor is selected from the resistor bank by a switching circuit. The selected resistor has a resistance that controls the charge to be stored in floating gate 5n (FIG. 4a). Thus each resistor represents a multi-bit value that can be presented by a specific combination of bits in an n-bit binary word. Preferably, the resistors are connected in parallel and have a common node that is coupled to a positive voltage such as $V_{dd}$ (not shown). For the initial programming, a voltage pulse with high voltage amplitude $V_{ddh}$, which is much greater than device saturation voltage $V_{sat}$, is applied to the control gate (such as gate 7n in FIG. 4a) and the drain electrode (such as drain 2n in FIG. 4a) for some period of time, until the device reaches the desired maximum threshold voltage $V_{thmax}$. In one embodiment, drain electrode 2n is coupled to port $P_0$, which is shown connected to $V_{ddh}$ without a resistor. Drain-Avalanche-Hot-Electron Injection (DAHEI) creates the maximum threshold voltage for the device, as illustrated in FIG. 4. In that condition, the initial state of the NFET-based EEPROM device can be considered to be in an all "zero" or all "one" state. The whole NFET EEPROM array can be set to this initial state. To program a cell to a state other than the initial state (e.g. the state corresponding to threshold voltage Vth$_2$), the NFET EEPROM is erased down from $V_{thmax}$ to $V_{th2}$ by applying gate voltage $V_{ge}$ to control gate 7n and switching drain electrode to port $P_2$, which is connected through resistor $R_2$ to $V_{ddh}$, where $R_2$ represents the selected value and a combination or set of multi-bits as shown in FIG. 7. The voltage $V_{ge}$ applied to the control gate 7n is enough to turn on the NFET EEPROM during the process. Since the steady-state threshold voltage in the write-down process is self-converged and independent of the initial maximum threshold voltage, there is no need to converge to an initial narrow distribution of the maximum threshold voltage for EEPROM arrays as long as the initial threshold voltage for each cell in the array is above the second highest threshold voltage.

The resistor switch shown in FIGS. 6 and 7 is connected by a logic circuit to represent a given state of multi-bits to be stored. Every port represents a unique combination or set of multi-bits. For example, FIG. 8 shows the switch assignment table mapping ports $P_0$ to $P_n$ (FIGS. 6 and 7) each to a particular value (i.e. a combination) of the n bits $B_1$~$B_{log2(n+1)}$; the selected resistor controls the charge stored on the floating gate 7n.

In accordance with one embodiment of the present invention, an EEPROM device is initially programmed to the highest threshold voltage of the EEPROM device. The multiple threshold voltages levels that are possible in each EEPROM device are provided between the lowest threshold voltage and the highest threshold voltage. Each threshold voltage level corresponds to a unique set of multi-bits. The number of bits that can be stored in the EEPROM device is given by $\log_2 N$, where N is the number of multiple threshold voltage levels. For example, sixteen threshold voltage levels can provide storage for four (4) bits. Due to Drain-Induced-Barrier-Lowering (DIBL) from the high voltage $V_{ddh}$, a moderate control gate voltage, Vge, is sufficient to turn on the NFET EEPROM device. This moderate control gate voltage is, however, insufficient to cause significant tunneling from the floating gate to the control gate, so that the threshold voltage is not changed.

The Drain-Avalanche-Hot Carriers (DAHC) are generated in the depleted region near the drain electrode. Since a highly positive voltage that is much greater than the saturation voltage is supplied to the drain electrode of an NFET, channel electrons are injected and accelerated in the drain depletion region. Electrons in the drain depletion region lose their energies in the impact ionization process. With a positive drain potential, electrons flow toward the drain electrode, while most holes move toward the substrate. However, some hot holes may gain greater energies than the oxide energy barrier (i.e., 3.7 ev) to reach and annihilate electrons in the floating gate, as shown in FIG. 4. The process reaches a steady state when the device current increase due to the down-shifting of the threshold voltage resulting from losing electrons in the floating gate balances the increase of the current flowing through the load resistor connecting the drain electrode to the supply voltage. The drain voltage drop due to the increase in current in the load resistor prevents the hot holes from gaining sufficient energy to flow over the oxide into the floating gate. Meanwhile, electron tunneling from the substrate to the floating gate is not significant due to the insufficient electrical field generated between the drain electrode and the floating gate, and between the floating gate and the control gate. Thus the number of electrons in the floating gate remains constant in the steady state.

Figure 9:
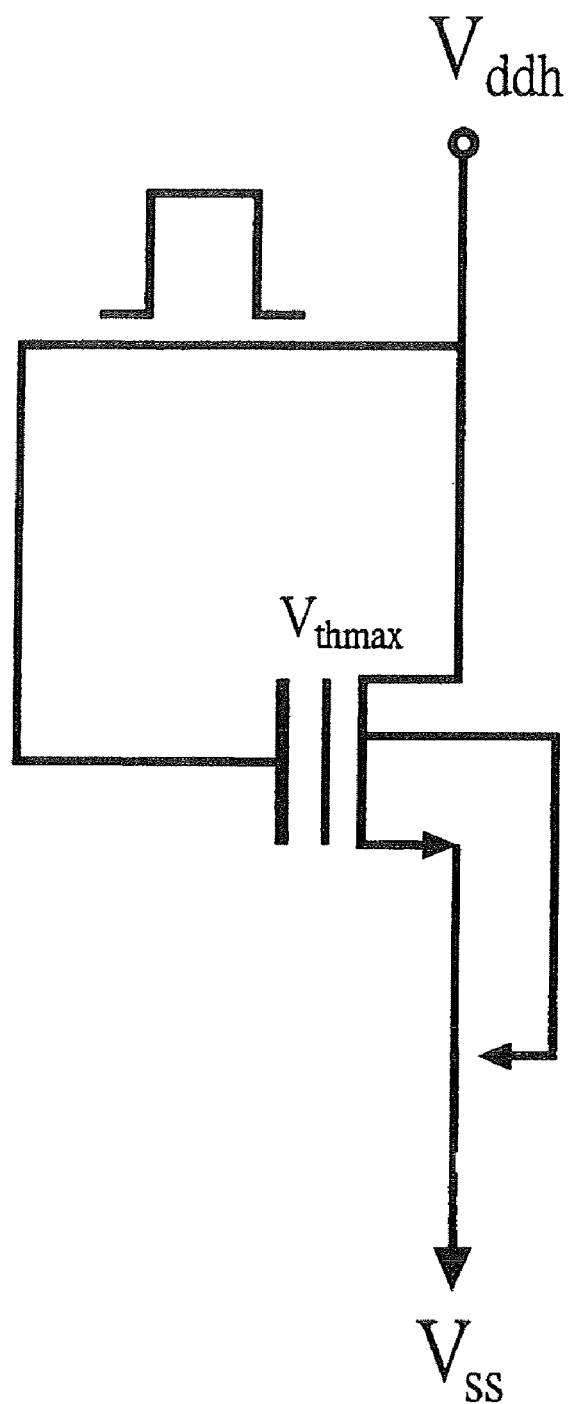
FIG. 9 shows the schematic of an NFET based EEPROM and illustrates its initial programming to a maximum threshold voltage, according to another embodiment of the present invention.
Figure 10:
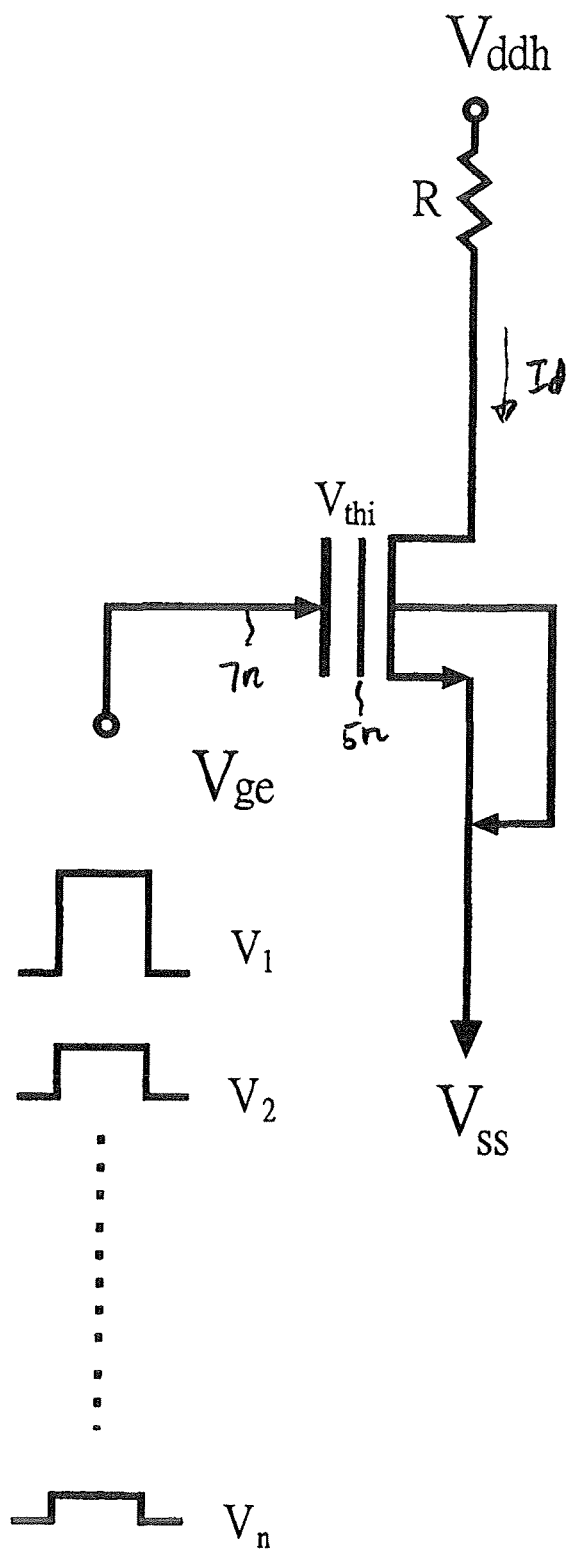
FIG. 10 illustrates the erase-down process by applying different voltage amplitudes for different values to be stored on the control gate of an NFET based EEPROM, according to the embodiment of the present invention illustrated n FIG. 9.
Figure 11:
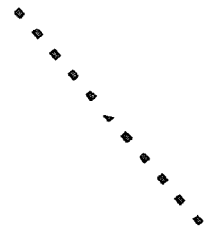
FIG. 11 shows an assignment table mapping amplitudes $V_1$ to $V_n$ each to a particular value (i.e. a combination) of the n bits $B_1 \sim B_{log2(n+1)}$; the selected amplitude controls the charge stored on the floating gate 7n FIG. 12 provides a simple schematic for a "READ" operation in an NFET-based EEPROM.

FIGS. 9, 10, and 11 show another embodiment of an NFET-based EEPROM cell. In this embodiment, the programming process to the highest threshold voltage is the same as the previous one. In the erase-down process, however, instead of connecting to a bank of multiple resistors (as shown in FIGS. 6 and 7), the NFET EEPROM device is connected to a fixed resistor R (FIG. 10). A gate voltage selected from a selection of different amplitudes (as indicated by pulses $V_1$ to $V_n$) is applied to control gate $7n$. NFET EEPROM is erased down to $V_{thi}$ by applying voltage $V_{gei}$ to the control gate, while the drain electrode is connected through the constant resistor R to the high voltage $V_{ddh}$. The applied gate voltage amplitude represents a unique value (i.e., a combination) of multi-bits. Thus, in one example, a circuit (called a "multi-voltage provider") applies a selected one of multiple voltage-amplitudes to the control gate $7n$ to represent the selected value of the multi-bits. The amplitudes of the gate voltage controls the value of the multi-bits to be stored in floating gate $7n$. FIG. 1 shows a table representing gate voltages ("none" to $V_n$) corresponding to the electrical charge represented by multi-bits $B_1$ to $B_{log2(n+1)}$ stored on floating gate $7n$.

To enable the erase-down process, the voltage amplitudes applied to control gate $7n$ are all large enough to turn on the NFET device. The horizontal potential difference between the pinch-off point of the NFET device and the drain voltage is $V_d-V_{sat}$ and the vertical potential difference is $V_d-V_f$ (see, e.g., FIGS. 4a and 4b). The hot holes injected into floating gate $5n$ in the depleted region gain their energies according to the absolute value of $e(V_d-V_{sat})$ and the absolute value of $e(V_d-V_f)$, where e is the electron charge. When drain voltage $V_d$ falls below the value at which hot holes in the depletion region do not have enough energy to flow over the oxide barrier onto floating gate $5n$, the number of electrons in the floating gate $5n$ remains constant, thereby leading to a smaller specific threshold voltage for the NFET EEPROM device. Drain voltage $V_d$ of the NFET of FIG. 10 is given by $V_{ddh}-I_dR$. For a given $V_{ge}$ and a given R, $I_d$ reaches a steady maximum current when the increase of resistor current resulting in the dropped drain voltage balances the increase of device current from threshold voltage lowering.

Figure 22:
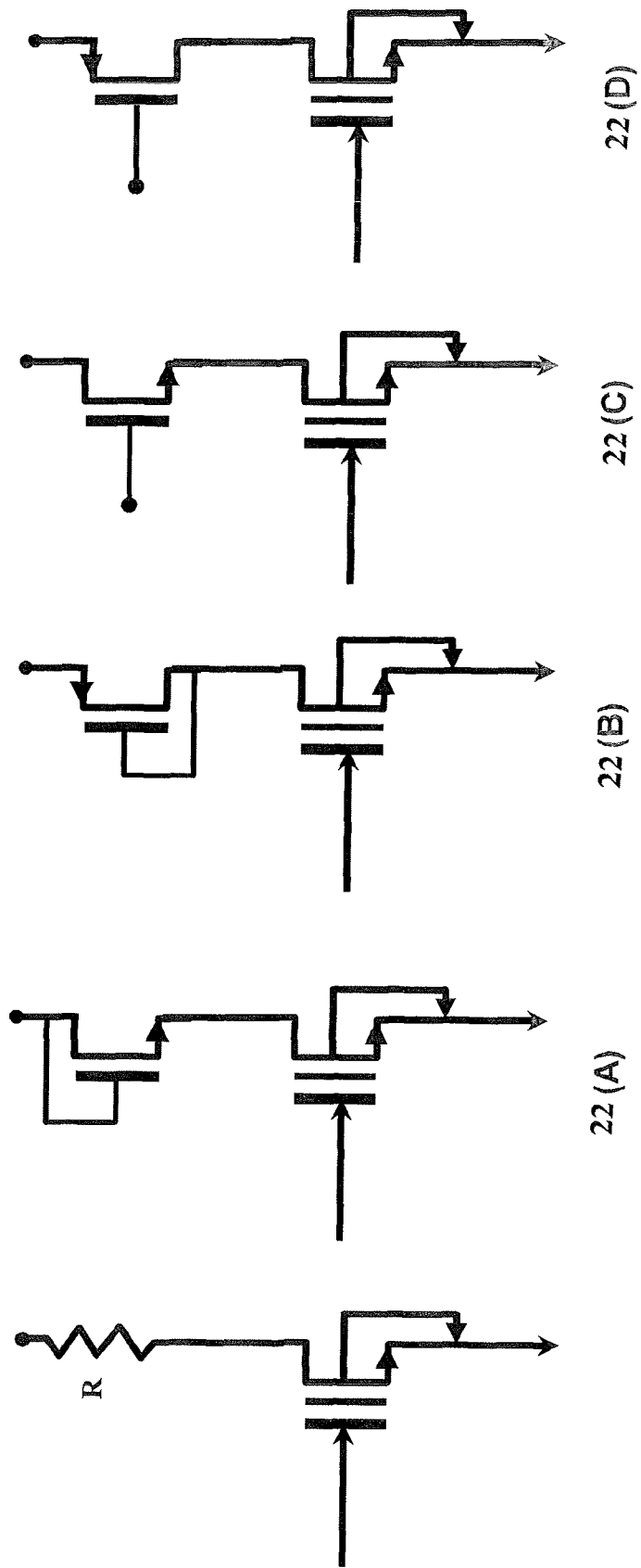
FIGS. 22(A), 22(B), 22(C) and 22(D) show different alternative implementations of load resistor R (e.g., load resistor R shown in FIG. 10), for a NFET EEPROM cell, according to one embodiment of the present invention.

FIGS. 22(A), 22(B), 22(C) and 22(D) show different alternative implementations of the load resistor R (e.g., load resistor R shown in FIG. 10), for a NFET EEPROM cell, according to one embodiment of the present invention. Load resistor R may be provided by a diode-connected NMOS transistor, as shown in FIG. 22(A) or a diode-connected PMOS transistor, as shown in FIG. 22(B). The resistance of the diode-connected transistor for a given technology may be determined by suitable sizing, as known to those skilled in the art. Alternatively, load resistor R may also be provided by biasing an NMOS transistor to operate in the linear region, using a known bias voltage at its gate electrode, as shown in FIG. 22(C). Similarly, load resistor R may also be provided by biasing a PMOS transistor to operate in the linear region, using a known bias voltage at its gate electrode, as shown in FIG. 22(D). The bias voltage at the gate electrode controls the current through the transistor and thus the effective resistance of the transistor, as is known to those skilled in the art.

A simple schematic for a "READ" operation for the device of FIG. 9 is shown in FIG. 12. The programmed NFET EEPROM device is read by applying a read voltage $V_{gr}$ to the control gate $7n$ with drain connected through load resistor $R_L$ to $V_{dd}$. The device driving current in response to different threshold voltage levels $V_{thi}$ generates an output voltage $V_{outi}$. The distinctive $V_{outi}$ can be mapped to a series of multi-bit numbers in a table and the closest value selected decodes output voltage $V_{outi}$ to the original bit representation $B_i$.

Figure 13:
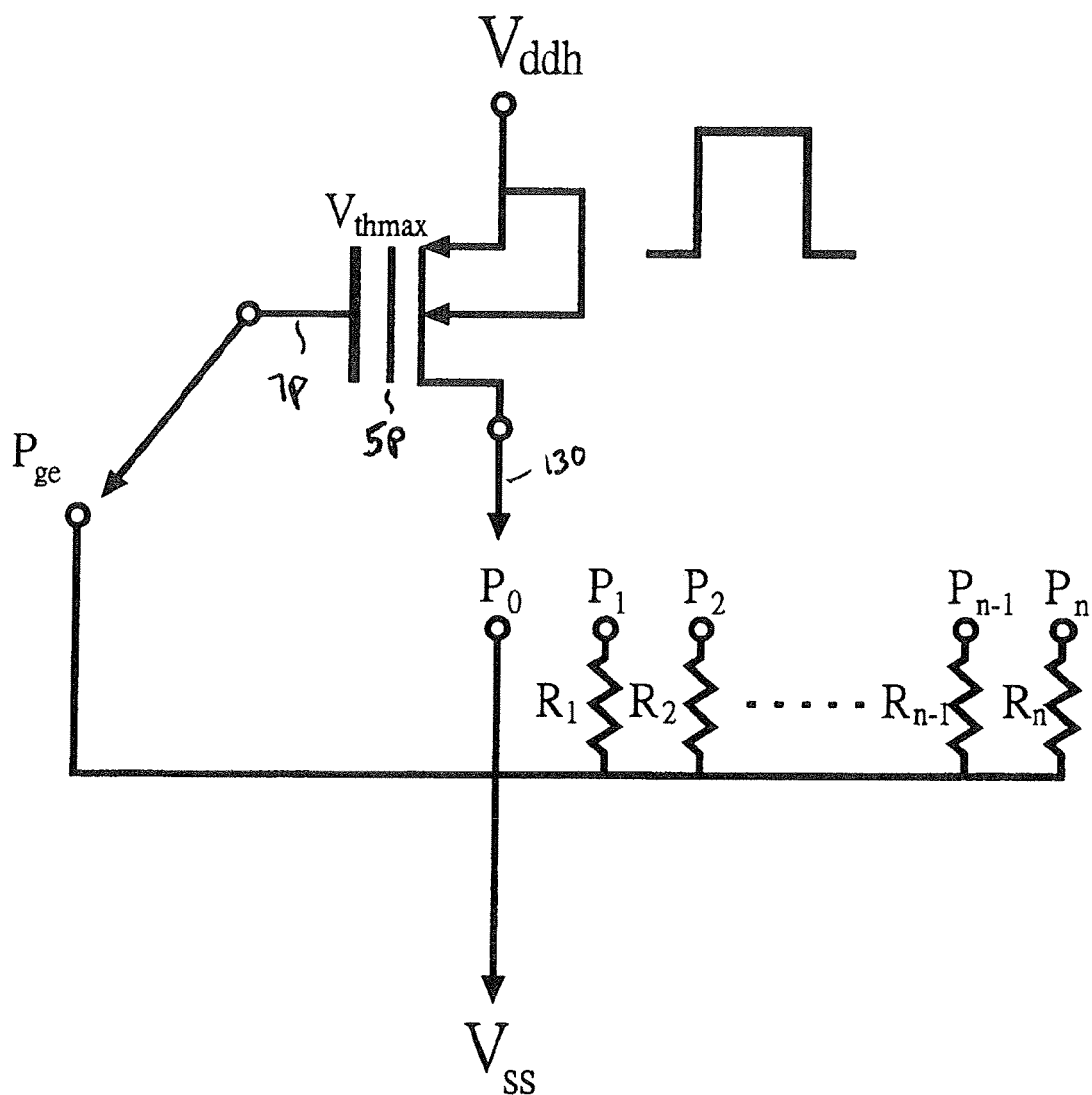
FIG. 13 shows an embodiment of a PFET based EEPROM and illustrates a pulse waveform representing initial programming to the most negative threshold voltage.

FIG. 13 shows a schematic of a PFET EEPROM cell (such as shown in FIGS. 5a and 5b) and a bank of parallel-connected resistors $R_1, R_2 \ldots, R_{n-1}, R_n$. Switch 130 selects one of resistors $R_1 \ldots R_n$ to store a charge on floating gate $5p$ representing a corresponding value of the multi-bits. Preferably, the resistors are connected in parallel and have a common node coupled to a low voltage Vss, which in one embodiment corresponds to system ground. PFET EEPROM in one embodiment is initially programmed to the most negative threshold voltage $V_{thmax}$ by applying high voltage $V_{ddh}$ to the source electrode and the substrate, while the control gate and the drain electrode are tied to $V_{ss}$. This programming utilizes Drain-Avalanche-Hot-hole Injection (DAHHI), as shown in FIG. 5. The initial state of each PFET EEPROM device can be considered as all "zero" or all "one". If desired, the entire PFET EEPROM array can be set to this initial state. The steady-state most negative threshold voltage in the write-up process is self-convergent and independent of the initial threshold voltage. Therefore, the initial narrow distribution of most negative threshold voltages for a PFET EEPROM array does not have to be converged as long as the initial threshold voltage for each cell devices in the array is more negative than the second lowest negative threshold voltage.

Figure 14:
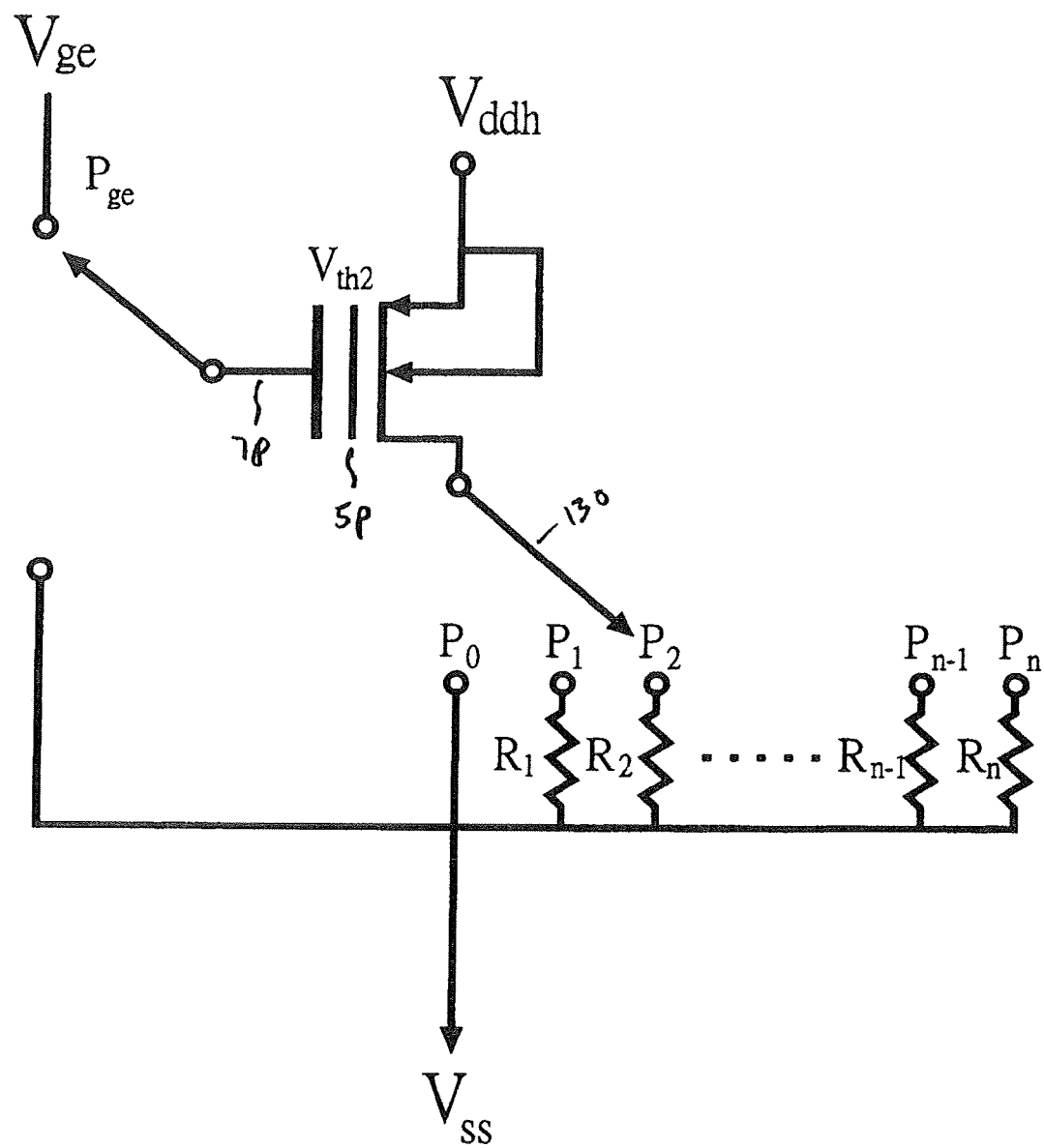
FIG. 14 illustrates the erase process to shift-up from the most negative threshold voltage $V_{thmax}$ to a specific negative threshold voltage $V_{th2}$ for the embodiment of FIG. 13.

To illustrate the write-up process, the drain electrode of the PFET cell is connected by switch 130 through resistor $R_2$ to low voltage $V_{ss}$, as shown in FIG. 14. Switch 130 connects a selected resistor which represents a value of multi-bits to be stored. For example, the drain electrode is connected by switch 130 to node $P_2$, which is connected through resistor $R_2$ to $V_{ss}$. A voltage $V_{ge}$ applied to the control gate 7p is low enough to turn on the PFET EEPROM device during the process. By applying gate voltage $V_{ge}$ to control gate 7p and by connecting drain electrode to port $P_2$, which connects through resistor $R_2$ to $V_{ss}$, PFET EEPROM is erased up from $V_{thmax}$ to $V_{th2}$. The table of FIG. 8 can also be used to map the multi-bit values stored on floating gate 5p (FIGS. 14, 5a and 5b) to corresponding selected resistors at node $P_0$ to $P_n$ (corresponding to resistors none, $R_1$, $R_2$ ... $R_n$ respectively). Due to Drain-Induced-Barrier-Lowering (DIBL) from high voltage $V_{ddh}$, a moderate low control gate voltage is sufficient to turn on the PFET EEPROM device shown in FIG. 14, This voltage is, however, insufficient to cause significant electron tunneling from the floating gate 5p to the control gate 7p and from the substrate to the floating gate 5p.

The Drain-Avalanche-Hot Carriers (DAHC) are generated in the depleted region near the drain electrode. Since the drain electrode is supplied with a highly negative voltage more negative than the saturation voltage relative to the source, channel holes are injected and accelerated in the drain depletion region. Holes in the drain depletion region lose their energies in the impact ionization process. With the negative drain potential, holes flow toward the drain electrode, while most electrons move toward the substrate. However, some hot electrons gain greater energies than the oxide energy barrier (i.e., 3.1 ev) to reach and annihilate holes in the floating gate 5p, as shown in FIGS. 5a and 5b. The process reaches a steady state when the device current increase due to the up-shifting of the threshold voltage resulting from losing holes in the floating gate balances the increase of the current flowing through the resistor. The raised drain voltage due to the increase in current flow in the load resistor is insufficient to support a hot electron flow over the oxide 4p (FIGS. 5a and 5b) to floating gate 5p. Meanwhile, tunneling in this process is not significant due to the insufficient electrical field generated between the drain electrode and floating gate 5p, and between floating gate 5p and control gate 7p. Thus the number of holes in the floating gate remains constant in the steady state.

Figure 15:
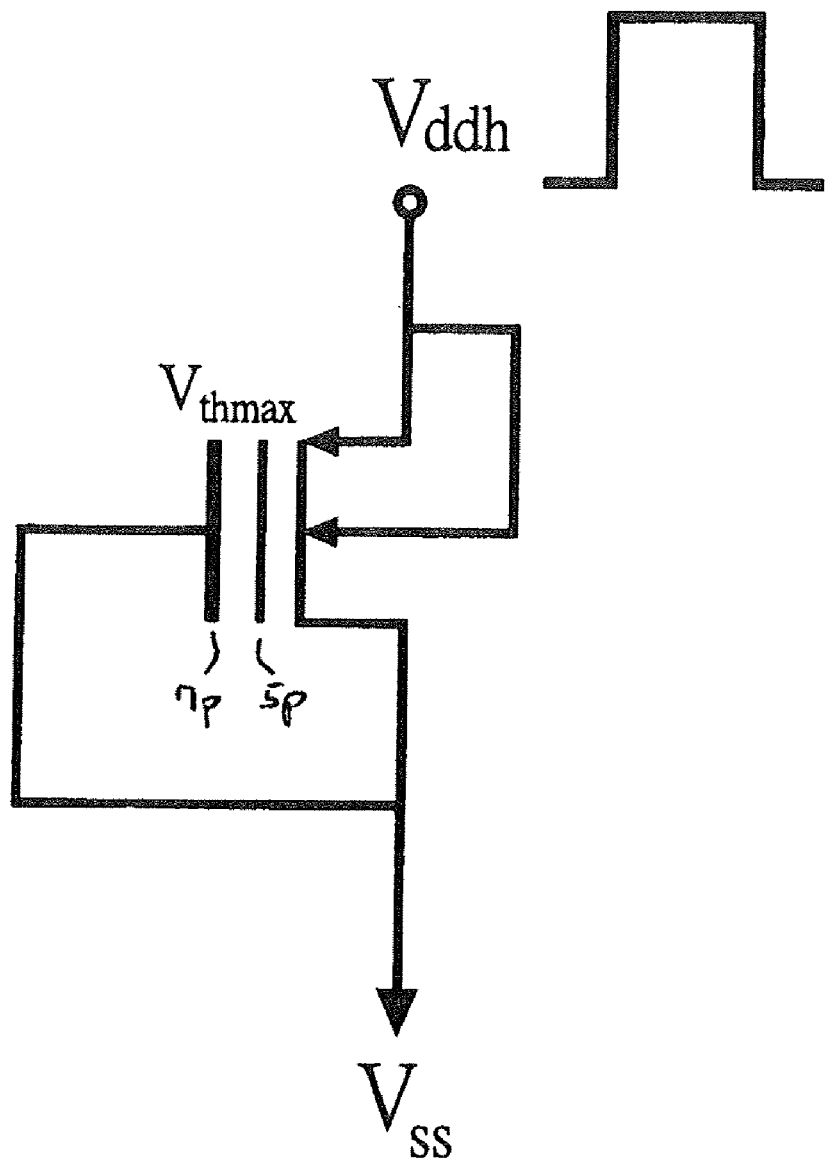
FIG. 15 shows a schematic of a PFET-based EEPROM and illustrates a pulse waveform representing its initial programming to the most negative threshold voltage, in accordance with another embodiment of the present invention.
Figure 16:
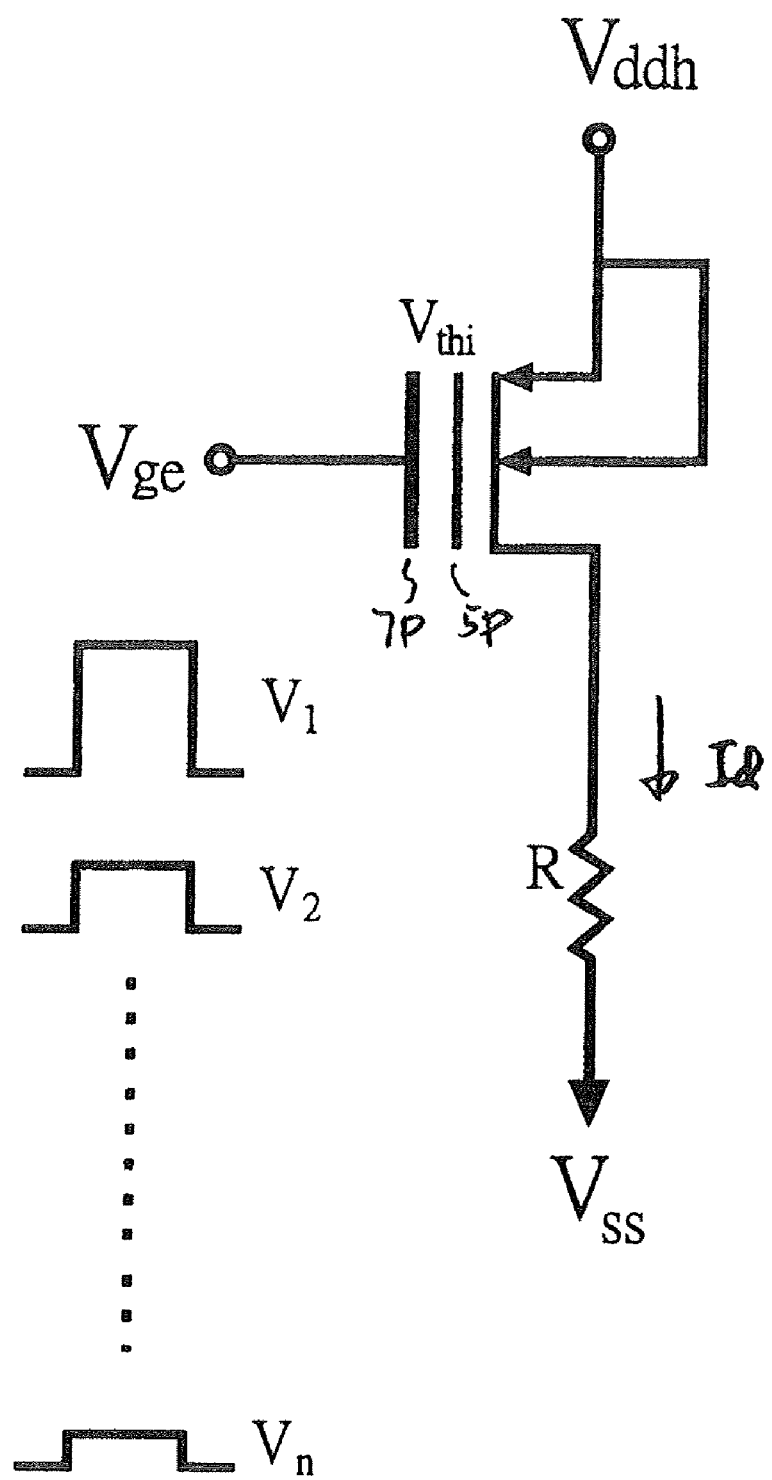
FIG. 16 illustrates the erase-up process for PFET-based EEPROM of FIG. 15 by applying different voltage amplitudes on the control gate.

FIGS. 15 and 16 show a PFET EEPROM, according to another embodiment of the present invention. In the embodiment, the programming process to the most negative threshold voltage is the same as that illustrated in FIGS. 9-11. PFET EEPROM is initially programmed to the most negative $V_{thmax}$ by applying high voltage $V_{ddh}$ to the source electrode and the substrate, while the control gate and drain electrode are tied to reference voltage $V_{ss}$. However, in the erase-up process, instead of switching to a bank of multiple resistors, the PFET EEPROM device is connected to a fixed resistor R (see FIG. 16). A gate voltage selected from a selection of different amplitudes is applied to the control gate, as indicated by pulses $V_1$ to $V_n$ in FIG. 16. PFET EEPROM is erased up to threshold voltage $V_{thi}$ by applying voltage $V_{gei}$ to control gate 7p, while the drain electrode is connected to the constant resistor R to voltage $V_{ss}$. The amplitudes of the gate voltages represent values of the multi-bits capable of being stored on floating gate 5p as shown in the table in FIG. 11.

To enable the erase-up process, the amplitudes of the voltages applied to control gate 7p are all low enough to turn on the device. The potential difference between the pinch-off point of the PFET and the drain voltage is $V_d$-$V_{sat}$ and the vertical potential difference is $V_d$-$V_f$. The hot electrons injected into floating gate 5p from the depletion region have an energy given by the absolute value of $e(V_d-V_{sat})$, and the absolute value of $e(V_d-V_f)$ where e is the electron charge. When the drain voltage $V_d$ is raised to some point such that hot electrons in the depletion region do not have enough energy to flow over the oxide barrier 4p (i.e., 3.1 volts), the number of holes in floating gate 5p remains a constant leading to a specific less negative threshold voltage for the PFET EEPROM device. Drain voltage $V_d$ is given by $V_{ss}+I_dR$ (FIG. 16). For given values of $V_g$ and R, $I_d$ reaches a maximum steady current when the increase of resistor current $I_d$ resulting in the raised drain voltage balances the increase of device current from rising negative threshold voltage.

Figure 23:
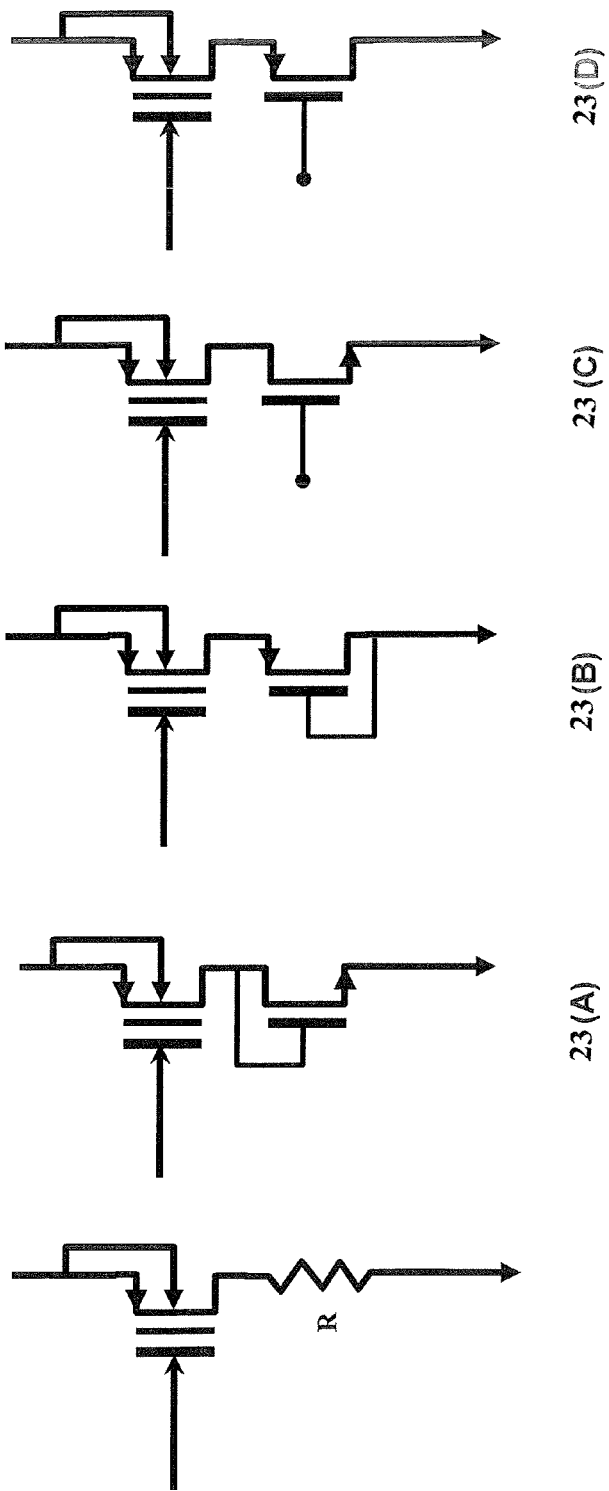
FIGS. 23(A), 23(B), 23(C) and 23(D) show different alternative implementations of load resistor R (e.g., load resistor R shown in FIG. 16), for a PFET EEPROM cell, according to one embodiment of the present invention.

FIGS. 23(A), 23(B), 23(C) and 23(D) show different alternative implementations of the load resistor R (e.g., load resistor R shown in FIG. 16), for a PFET EEPROM cell, according to one embodiment of the present invention. Load resistor R may be provided by a diode-connected NMOS transistor, as shown in FIG. 23(A) or a diode-connected PMOS transistor, as shown in FIG. 23(B). The resistance of the diode-connected transistor for a given technology may be determined by suitable sizing, as known to those skilled in the art. Alternatively, load resistor R may also be provided by biasing an NMOS transistor to operate in the linear region, using a known bias voltage at its gate electrode, as shown in FIG. 23(C). Similarly, load resistor R may also be provided by biasing a PMOS transistor to operate in the linear region, using a known bias voltage at its gate electrode, as shown in FIG. 23(D). The bias voltage at the gate electrode controls the current through the transistor and thus the effective resistance of the transistor, as is known to those skilled in the art.

FIG. 17 shows a schematic for a "READ" operation in the PFET EEPROM cell of FIGS. 15-16. The programmed PFET EEPROM device is read by applying a read voltage $V_{gr}$ to control gate 7p with the drain electrode connected through sink resistor R to ground. Each device driving current $I_d$ in response to a different threshold voltage level passes through resistor R to generate the output voltage $V_{outi}$. The distinctive $V_{outi}$ can be decoded to the original bit representation as described above in conjunction with FIG. 12.

Figure 18:
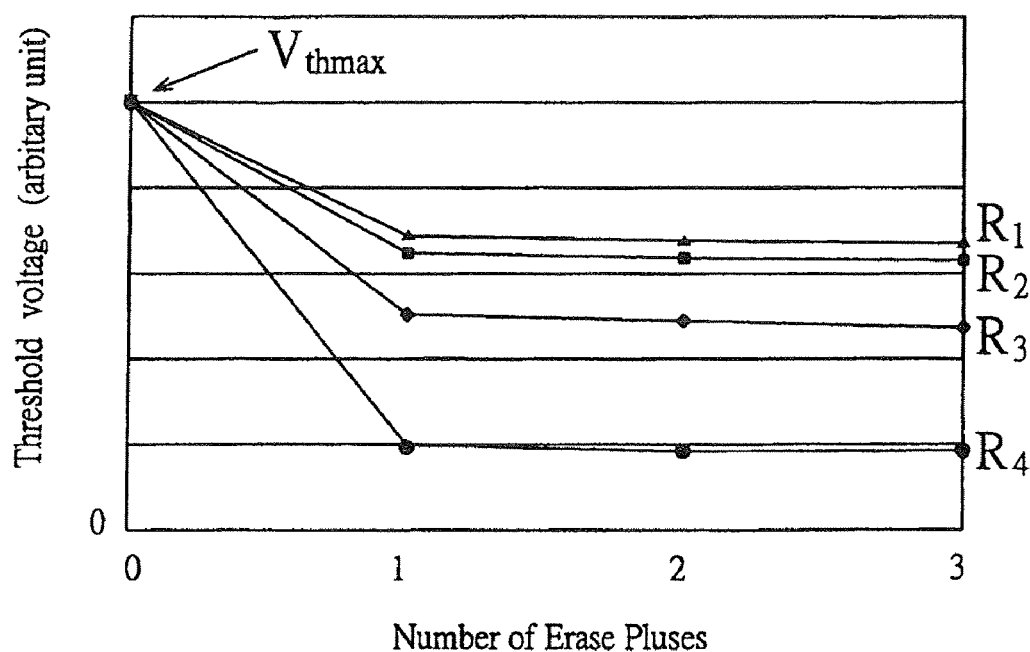
FIG. 18 shows typical steady state threshold voltage curves versus the number of erase voltage pulses applied with different resistor values for an NFET based EEPROM as illustrated in FIG. 7.
Figure 19:
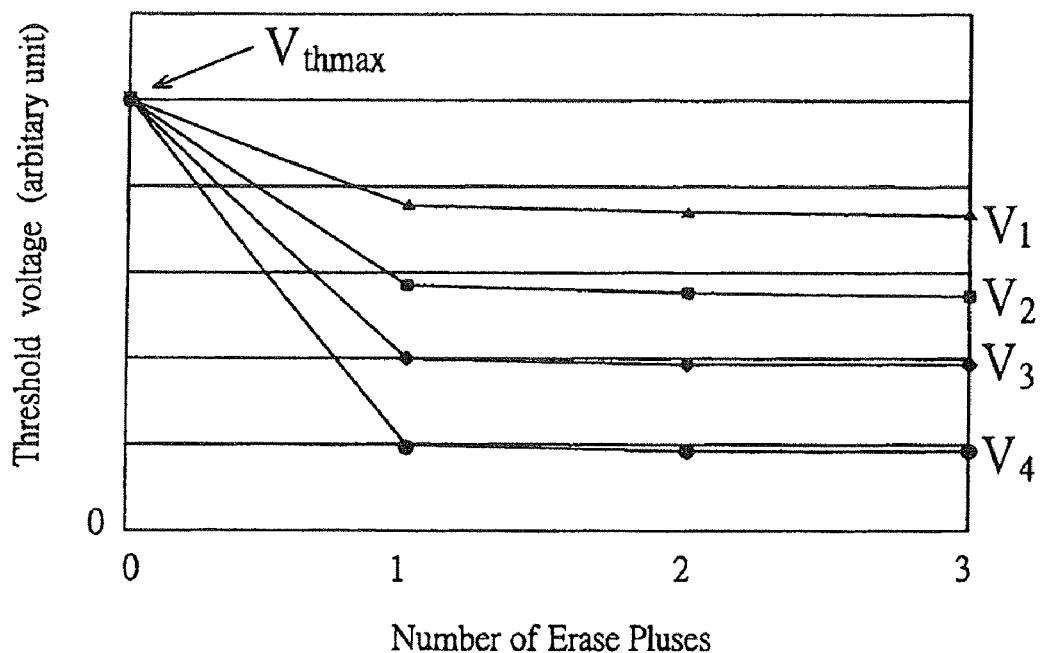
FIG. 19 shows typical steady state threshold voltage curves versus the number of erase voltage pulses applied with different applied voltage amplitudes on the control gate for an NFET based EEPROM as illustrated in FIG. 10.

FIGS. 18 and 19 show, in the NFET EEPROM cells of FIGS. 7 and 10, typical NFET threshold voltage changes versus the number of times of erase-down operations are applied using different resistors and different control voltage amplitudes, respectively, according to one embodiment of the present invention. Note that the threshold voltage of the NFET EEPROM device reaches a constant value after the first erase operation is performed. In FIG. 18, the larger the resistor the smaller the maximum drain current and the less the threshold voltage can be down-shifted. In other words, the higher the resistor value, the higher the threshold voltage of the NFET EEPROM. In FIG. 19, the larger the control gate voltage the smaller $V_d$-$V_{sat}(V_g)$. With a larger $V_{sat}$, the less the threshold voltage can be down-shifted. In other words, the larger the applied gate voltage amplitude, the higher the threshold voltage of the NFET that can be reached.

Figure 20:
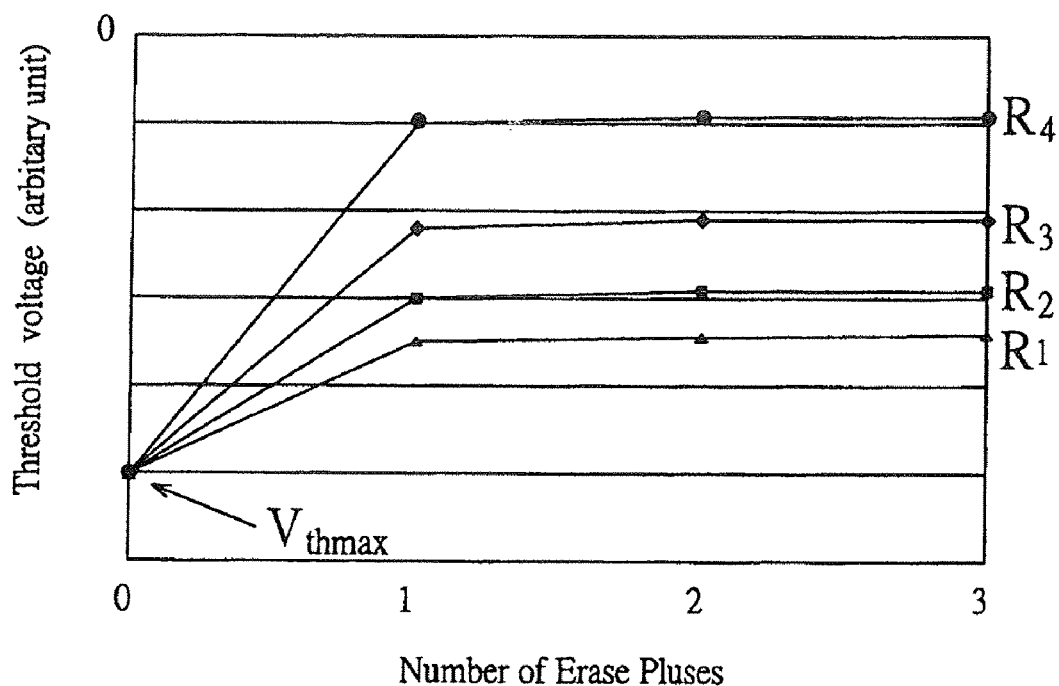
FIG. 20 shows typical steady state threshold voltage curves versus the number of erase voltage pulses applied with different resistor values for a PFET based EEPROM as illustrated in FIG. 14.
Figure 21:
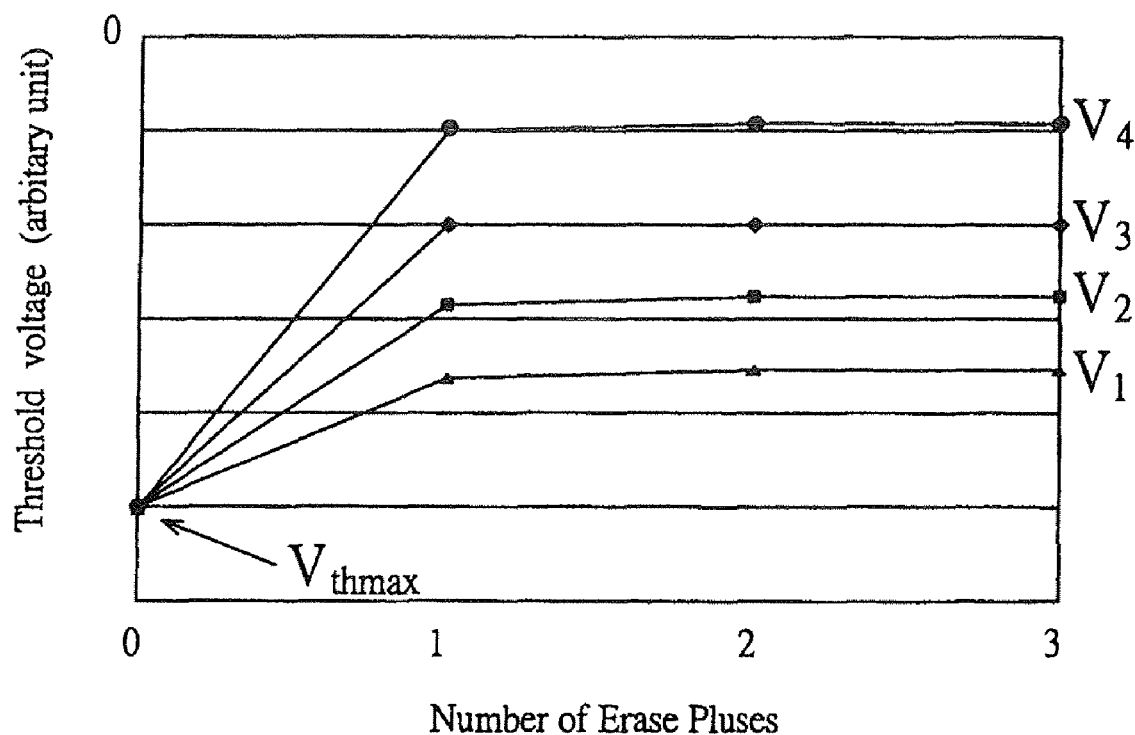
FIG. 21 shows typical steady state threshold voltage curves versus the number of erase voltage pulses applied with different amplitudes on the control gate for a PFET based EEPROM as illustrated in FIG. 16.

FIGS. 20 and 21 show, for PFET-based EEPROM cells shown in FIG. 14 and FIG. 16, typical PFET threshold voltage changes versus the number of times of erase-up applied for different resistors and for different control voltage amplitudes, respectively. Note that the threshold voltage of the PFET EEPROM device reaches a constant value after the first erase operation is performed. In FIG. 20, the larger the resistor the smaller the maximum drain current and the less the threshold voltage can be up-shifted. In other words, the higher the resistor value, the more negative the threshold voltage of the PFET EEPROM that can be reached. In FIG. 21, the more negative the control gate voltage the smaller $V_d$-$V_{sat}$. This decreases the amount the threshold voltage can be up-shifted. In other words, the more negative the applied voltage amplitude, the more negative the threshold voltage of the PFET that can be reached.

In conclusion, structures and methods are disclosed to achieve multi-bit storage in a single EEPROM cell both for NFET-based and PFET-based nonvolatile memories. The disclosed structures obviate the need for complicated convergent circuits. With the advantages of larger bit capacity for a single cell and no convergent circuit, the disclosed structures reduce the per-bit cost for EEPROM capable of storing multi-bit values.

As will be understood by persons skilled in the art, the foregoing preferred embodiment of the present invention is illustrative rather than limiting. Having described the invention in connection with preferred embodiments, modifications will now suggest themselves to those skilled in the art. Thus, the invention is not to be limited to the embodiments described but rather includes various modifications and similar arrangements within the spirit and scope of the appended claims. The scope of the claims should be accorded the broadest interpretation so as to encompass all such modifications and similar structures. While the preferred embodiments of the invention have been illustrated and described, various changes can be made therein without departing from the spirit and scope of the invention.

What is claimed is:

1. A non-volatile memory structure for storing in a single nonvolatile memory cell information representable by multiple binary bits, comprising:
   a nonvolatile memory cell having a drain electrode, and a source electrode capable of being coupled to a first reference voltage supply; and
   a switch circuit coupled to the drain electrode of the nonvolatile memory cell, the switch circuit presenting to the drain electrode non-volatile memory cell any one of multiple different voltages each representing a different value representable by the multiple binary bits.

2. A non-volatile memory structure as in claim 1, wherein the switch circuit comprises a resistive element coupling the drain electrode to a second reference voltage supply.

3. A non-volatile memory structure as in claim 2, wherein the resistive element comprises a diode-connected MOS transistor.

4. A non-volatile memory structure as in claim 2, wherein the resistive element comprises an MOS transistor capable of being biased to operate in a linear region.

5. A non-volatile memory structure as in claim 1, wherein the switch circuit includes a plurality of resistors connected in parallel.

6. A non-volatile memory structure as in claim 5, wherein the resistances of the plurality of resistors are different.

7. A non-volatile memory structure as in claim 1, further comprising a control gate voltage switch having one end connected to a control gate and another end capable of being switched between a high voltage source and an erase voltage source.

8. A non-volatile memory structure as in claim 1, wherein said nonvolatile memory cell comprises an electrically erasable programmable read-only memory (EEPROM).

9. A method for storing information capable of being represented by multiple binary bits in a single nonvolatile memory cell, comprising:
   programming the nonvolatile memory cell to a first threshold voltage by applying a first voltage to the control gate and the drain electrode of the nonvolatile memory cell; and
   programming the non-volatile memory cell to a second threshold voltage by applying a gate voltage to the control gate and applying at the drain electrode of the nonvolatile memory cell any one of a plurality of predetermined voltages each representing a value representable by the multiple binary bits.

10. A method as in claim 9, wherein the predetermined voltage at the drain electrode is provided by a switch circuit comprising a resistive element coupling the drain electrode to a reference voltage supply.

11. A method as in claim 10, wherein the resistive element comprises a diode-connected MOS transistor.

12. A method as in claim 10, wherein the resistive element comprises an MOS transistor capable of being biased to operate in a linear region.

13. A method as in claim 9, wherein the predetermined voltage at the drain electrode is provided by a switch circuit comprising a plurality of resistors connected in parallel.

14. A method as in claim 13, wherein the resistance of each resistor in said plurality of resistors differs from the resistances of the other resistors in said plurality of resistors.

15. A method as in claim 9, wherein said nonvolatile memory cell comprises an electrically erasable programmable read-only memory (EEPROM).

16. A method for reading out information stored in a single nonvolatile memory cell including a control gate, a source, and a drain, said information capable of being represented by an n-bit binary word, where n is a selected integer, comprising:
   applying a read voltage to said control gate of said nonvolatile memory; and
   connecting said drain to a selected voltage through a current load;
   wherein a driving current of said nonvolatile memory cell in response to a threshold voltage of said memory cell being applied to said control gate generates an output voltage corresponding to said information stored in said cell.

17. The method of claim 16, wherein said output voltage can be compared to voltages in a table corresponding to a series of n-bit words and converted to the original n-bit word by selecting the n-bit word in the table corresponding to a voltage in said table which corresponds most closely to said output voltage.

18. The method of claim 16, wherein said nonvolatile memory comprises an NFET based electrically erasable programmable read-Only memory (EEPROM).

19. A method for reading out information stored in a single nonvolatile memory cell including a control gate, a source, and a drain, said information capable of being represented by an n-bit binary word, where n is a selected integer, comprising:
   applying a read voltage to said control gate of said nonvolatile memory; and
   connecting said drain to ground through a current sink;
   wherein a driving current of said nonvolatile memory passing through said current sink in response to a threshold voltage of said memory cell being applied to said control gate generates an output voltage corresponding to said information stored in said cell.

20. The method of claim 19, wherein said output voltage can be compared to voltages in a table corresponding to a series of n-bit words and converted to the original n-bit word by selecting the n-bit word in the table corresponding to the voltage in said table which corresponds most closely to said output voltage.

21. The method of claim 19, wherein said nonvolatile memory comprises a PFET based electrically erasable programmable read-only memory (EEPROM).

* * * * *